(12) United States Patent
Kato et al.

(10) Patent No.: US 8,089,497 B2
(45) Date of Patent: Jan. 3, 2012

(54) DISPLAY DEVICE AND DRIVING METHOD THEREOF

(75) Inventors: Masakazu Kato, Kanagawa (JP); Katsuhide Uchino, Kanagawa (JP); Hidekazu Miyake, Kanagawa (JP)

(73) Assignee: Sony Corporation, Tokyo (JP)

( * ) Notice: Subject to any disclaimer, the term of this patent is extended or adjusted under 35 U.S.C. 154(b) by 185 days.

(21) Appl. No.: 12/656,047

(22) Filed: Jan. 14, 2010

(65) Prior Publication Data

US 2010/0201717 A1 Aug. 12, 2010

(30) Foreign Application Priority Data

Feb. 9, 2009 (JP) ................................. 2009-027336

(51) Int. Cl.
G09G 5/10 (2006.01)
(52) U.S. Cl. ............... 345/690; 345/76; 345/77; 345/89
(58) Field of Classification Search ............. 345/76–84, 345/87–98, 690; 315/169.1–169.4
See application file for complete search history.

(56) References Cited

U.S. PATENT DOCUMENTS

| | | | | |
|---|---|---|---|---|
| 6,356,026 B1 * | 3/2002 | Murto | ...................... | 315/111.81 |
| 6,693,388 B2 * | 2/2004 | Oomura | ...................... | 315/169.3 |
| 2007/0268210 A1 | 11/2007 | Uchino et al. | | |
| 2008/0001545 A1 | 1/2008 | Uchino et al. | | |

FOREIGN PATENT DOCUMENTS

| | | |
|---|---|---|
| JP | 2007-310311 | 11/2007 |
| JP | 2008-009198 | 1/2008 |
| JP | 2008-058940 A | 3/2008 |
| JP | 2008-164796 A | 7/2008 |
| JP | 2008-176141 A | 7/2008 |
| JP | 2008-197517 A | 8/2008 |
| JP | 2008-304684 A | 12/2008 |

OTHER PUBLICATIONS

Japanese Office Action issued Mar. 15, 2011 for corresponding Japanese Application No. 2009-027336.

* cited by examiner

*Primary Examiner* — Vijay Shankar
(74) *Attorney, Agent, or Firm* — Rader, Fishman & Grauer PLLC

(57) ABSTRACT

A driving method for a display device includes the steps of: performing writing processing to apply a video signal to a first node over a data line via a writing transistor with a predetermined driving voltage applied from a power supply to one of source/drain regions of a driving transistor, wherein the trailing edge of a scanning signal to be applied to a gate electrode of the writing transistor at the writing processing step is inclined; and the luminance characteristic of display elements connected onto each of a scan lines is controlled by controlling the crest value of the scanning signal, which is applied to first to M-th scan lines, for each of the scan lines.

6 Claims, 17 Drawing Sheets

[EMBODIMENT]

[EMBODIMENT]

[EMBODIMENT]
FIG.5A
[TP(2)₀]
FIG.5B
[TP(2)₁]
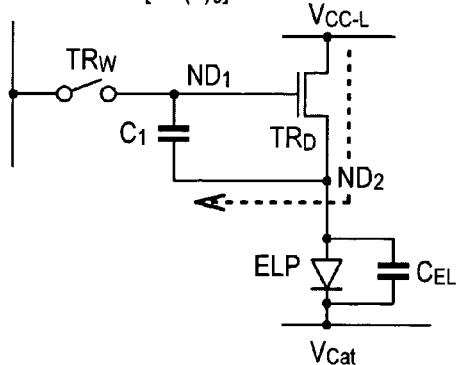
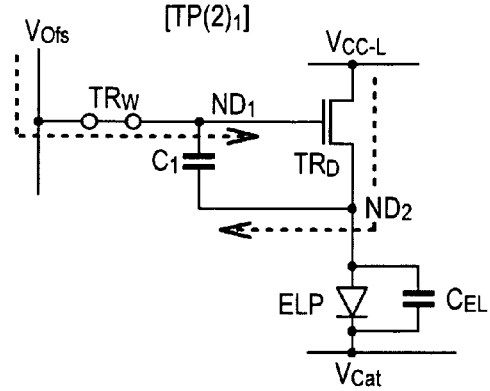
FIG.5C
[TP(2)₂]
FIG.5D
[TP(2)₃]
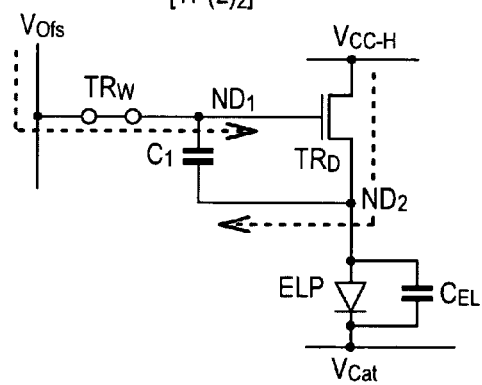
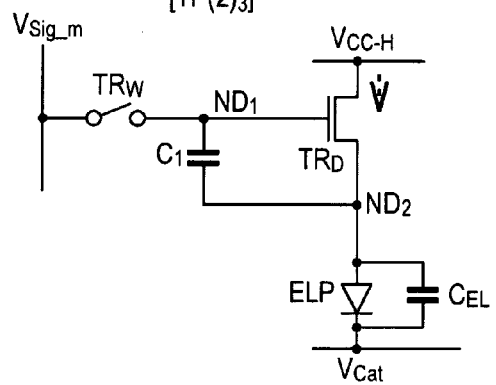
FIG.5E
[TP(2)₄]
FIG.5F
[TP(2)₅]
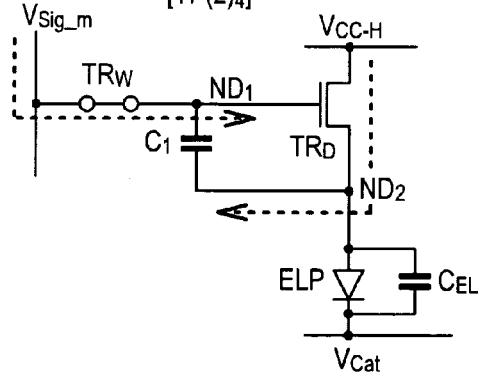
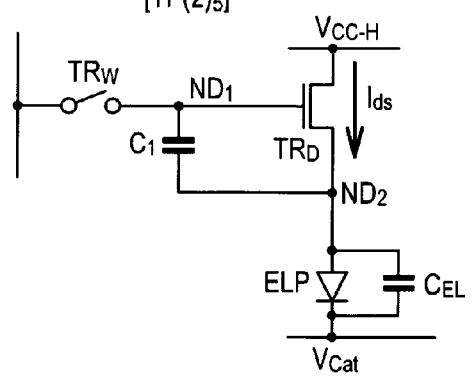

[EMBODIMENT]
FIG.6A
[TP(2)₇]
FIG.6B
[TP(2)₊₁]
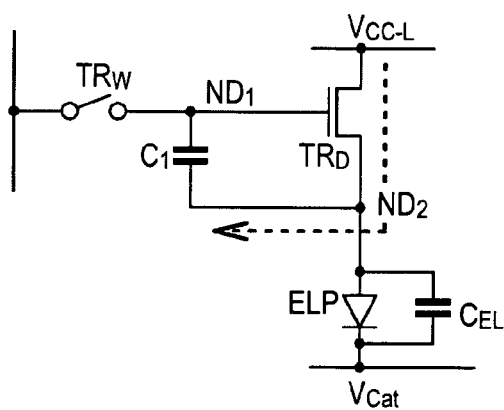
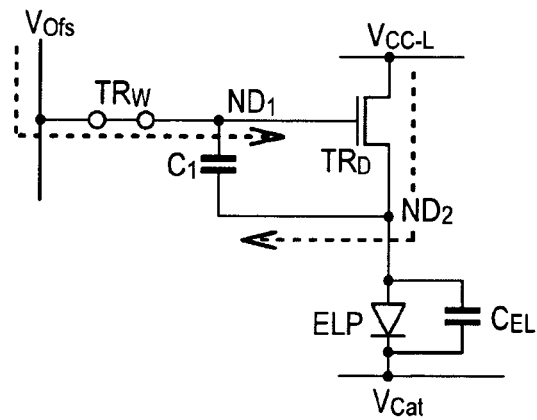

[EMBODIMENT]

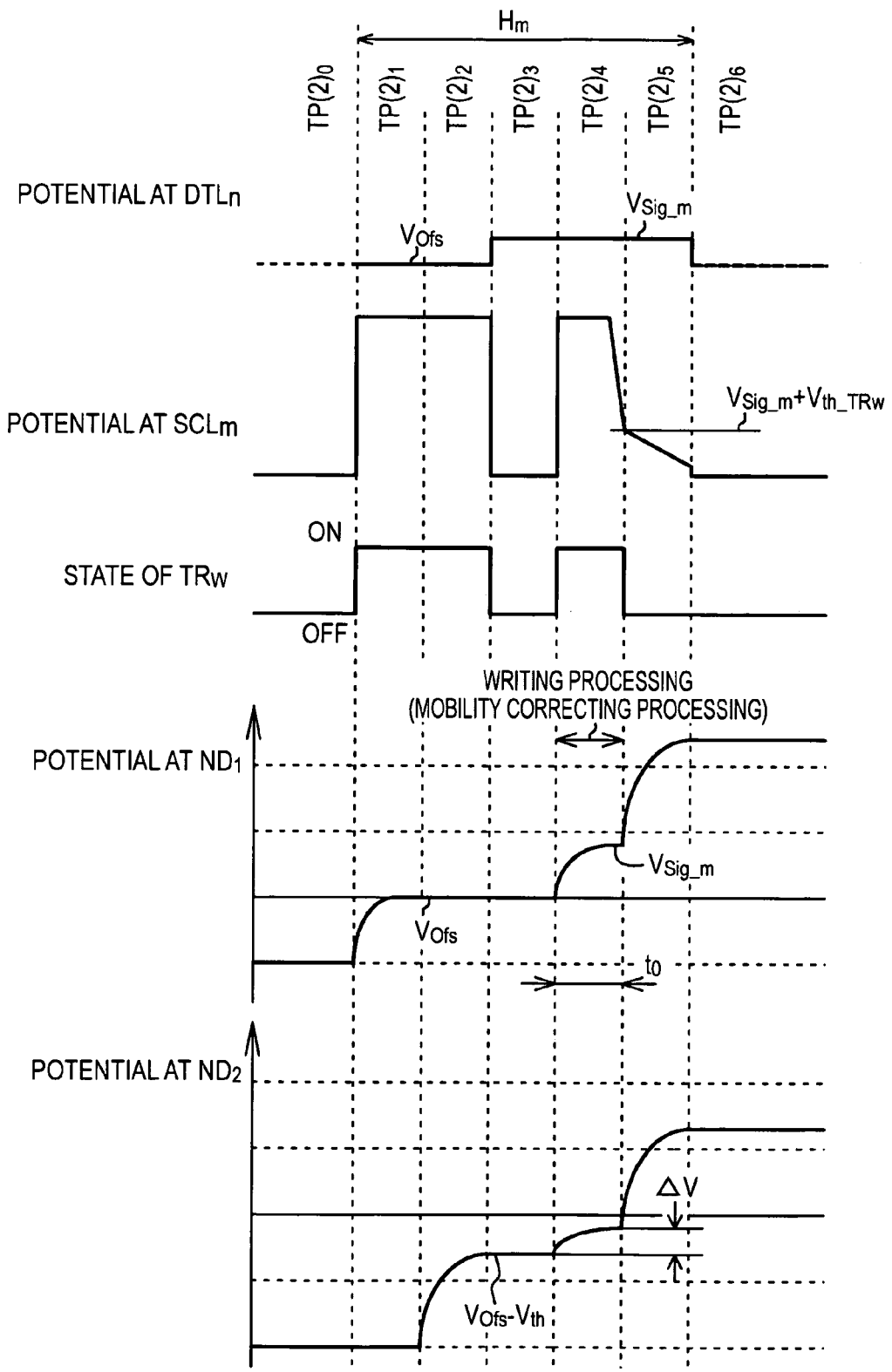

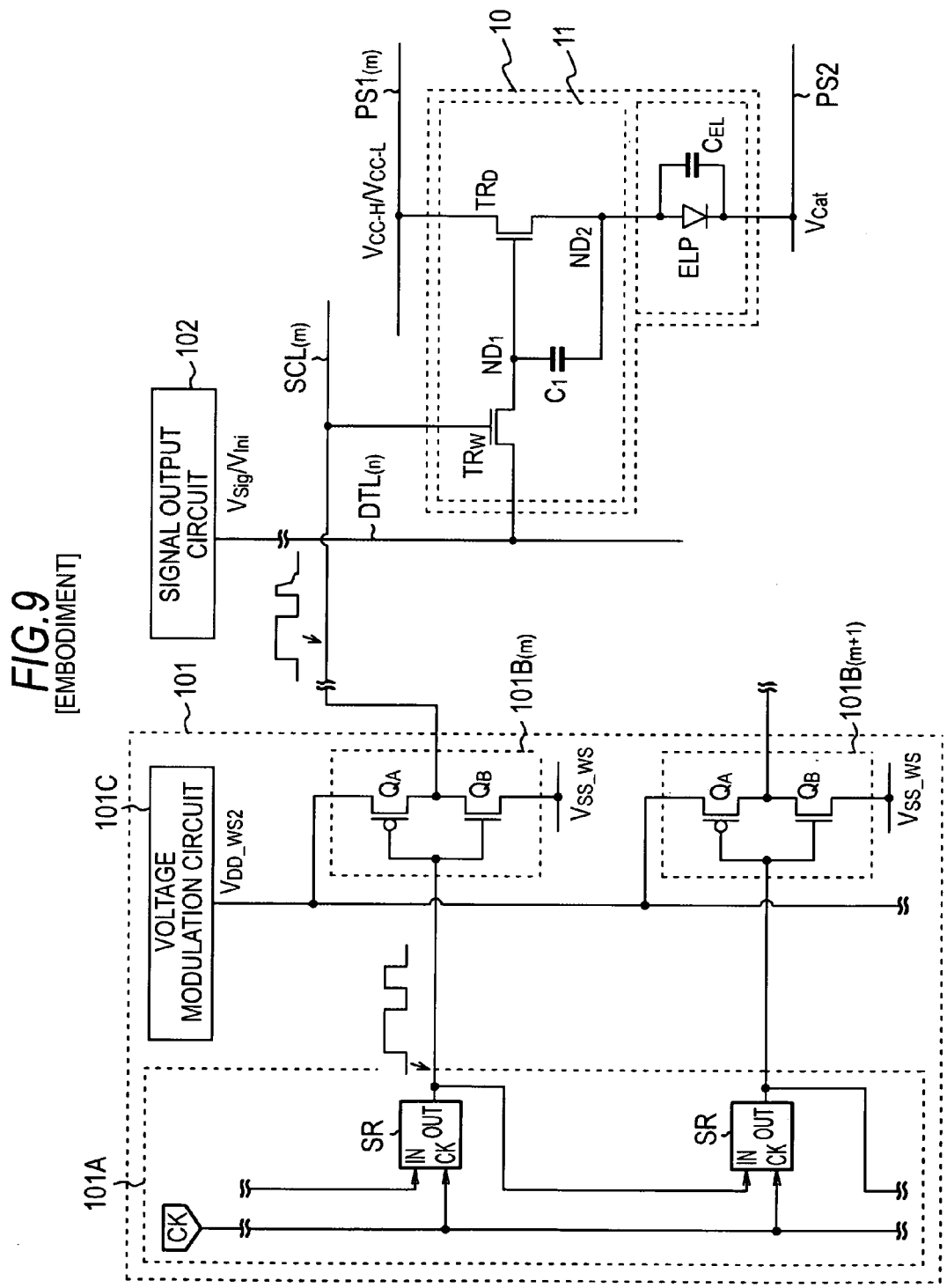
FIG.9 [EMBODIMENT]

[EMBODIMENT]

[EMBODIMENT]

[EMBODIMENT]

[EMBODIMENT]

[EMBODIMENT]

DISPLAY DEVICE AND DRIVING METHOD THEREOF

BACKGROUND OF THE INVENTION

1. Field of the Invention

The present invention relates to a display device and a driving method for the display device.

2. Description of the Related Art

Display elements each including a current-driven light emitting section, and a display device including the display elements are already known. For example, a display element including an organic electroluminescent light emitting section made of electroluminescence (may be abbreviated to EL) that is an organic material (hereinafter, may be called an organic EL display element) has attracted attention as a display element capable of emitting high-luminance light when being driven with a low-voltage direct current.

Similarly to liquid-crystal display devices, for example, even a display device including the organic EL display elements (hereinafter, may be called an organic EL display device) is known to adopt as a driving method a passive matrix method or an active matrix method. The active matrix method has the demerit that a structure becomes complex but has the merit that the luminance of an image is high. The organic EL display element to be driven according to the active matrix method includes, in addition to a light emitting section formed with an organic layer including a luminous layer, a drive circuit that drives the light emitting section.

As a circuit for driving the organic electroluminescent light emitting section (hereinafter, may be called simply a light emitting section), a drive circuit including two transistors and one capacitor (called a 2Tr/1C drive circuit) has been revealed in, for example, JP-A-2007-310311 (patent document 1). The 2Tr/1C drive circuit includes, as shown in FIG. 2, two transistors of a writing transistor $TR_W$ and a driving transistor $TR_D$, and further includes a capacitor $C_1$. Herein, the other source/drain region of the driving transistor $TR_D$ forms a second node $ND_2$, and the gate electrode of the driving transistor $TR_D$ forms a first node $ND_1$.

As seen from the timing chart of FIG. 4, pre-processing necessary to perform threshold-voltage canceling processing is executed during a period $TP(2)_1$. Specifically, a first-node initialization voltage $V_{Ofs}$ (for example, 0 V) is applied to the first node $ND_1$ over a data line DTL via the writing transistor $TR_W$ put to an on state with a scanning signal sent over a scan line SCL. This causes the potential at the first node $ND_1$ to become equal to the voltage $V_{Ofs}$. A second-node initialization voltage $V_{CC-L}$ (for example, −10 V) is applied from a power supply 100 to the second node $ND_2$ via the driving transistor $TR_D$. This causes the potential at the second node $ND_2$ to become equal to the voltage $V_{CC-L}$. The threshold voltage of the driving transistor $TR_D$ shall be a voltage $V_{th}$ (for example, 3 V). The potential difference between the gate electrode of the driving transistor $TR_D$ and the other source/drain region (hereinafter, for brevity's sake, may be called a source region) thereof becomes equal to or larger than the voltage $V_{th}$. This brings the driving transistor $TR_D$ to the on state.

Thereafter, threshold-voltage canceling processing is performed during a period $TP(2)_2$. Specifically, while the writing transistor $TR_W$ is retained in the on state, the voltage generated by the power supply 100 is switched from the second-node initialization voltage $V_{CC-L}$ to a driving voltage $V_{CC-H}$ (for example, 20 V). As a result, the potential at the second node $ND_2$ is changed toward a potential obtained by subtracting the threshold voltage $V_{th}$ of the driving transistor $TR_D$ from the potential at the first node $ND_1$. In short, the potential at the floating second node $ND_2$ rises. When the potential difference between the gate electrode of the driving transistor $TR_D$ and the source region thereof reaches the voltage $V_{th}$, the driving transistor $TR_D$ is brought to an off state. In this state, the potential at the second node $ND_2$ generally takes on a value $(V_{Ofs}-V_{th})$.

Thereafter, during a period $TP(2)_3$, the writing transistor $TR_W$ is brought to the off state. The voltage on the data line DTL is set to a voltage equivalent to a video signal {a video signal (a driving signal and a luminance signal) $V_{Sig\_m}$ for use in controlling a luminance attained by the light emitting section ELP}.

Thereafter, writing processing is carried out during a period $TP(2)_4$. More particularly, the scan line SCL is driven to a high level in order to bring the writing transistor $TR_W$ to the on state. As a result, the potential at the first node $ND_1$ rises up to the video signal $V_{Sig\_m}$.

Now, $c_1$ denotes the capacitance of the capacitor $C_1$, and $c_{EL}$ denotes the capacitance of a capacitor $C_{EL}$ included in the light emitting section ELP. Further, $c_{gs}$ denotes the capacitance of a parasitic capacitor interposed between the gate electrode of the driving transistor $TR_D$ and the other source/drain region thereof. When the potential at the gate electrode of the driving transistor $TR_D$ is changed from the voltage $V_{Ofs}$ to the voltage $V_{Sig\_m}$ ($>V_{Ofs}$), the potentials at both the ends of the capacitor $C_1$ (in other words, the potentials at the first node $ND_1$ and second node $ND_2$) change in principle. Namely, a charge consistent with a change in the potential at the gate electrode of the driving transistor $TR_D$ (=potential at the first node $ND_1$) is distributed to the capacitor $C_1$, the capacitor $C_{EL}$ of the light emitting section ELP, and the parasitic capacitor between the gate electrode of the driving transistor $TR_D$ and the other source/drain region thereof. If the capacitance $c_{EL}$ is much larger than the capacitances $c_1$ and $c_{gs}$, a change in the potential in the other source/drain region of the driving transistor $TR_D$ derived from a change in the potential at the gate electrode of the driving transistor $TR_D$ ($V_{Sig\_m}-V_{Ofs}$) is limited. In general, the capacitance $c_{EL}$ of the capacitor $C_{EL}$ of the light emitting section ELP is larger than the capacitance $c_1$ of the capacitor $C_1$ and the capacitance $c_{gs}$ of the parasitic capacitor of the driving transistor $TR_D$. For convenience' sake, a description will proceed without consideration taken into a change in the potential at the second node $ND_2$ derived from a change in the potential at the first node $ND_1$. The timing chart for driving shown in FIG. 4 is completed without consideration taken into the change in the potential at the second node $ND_2$ derived from the change in the potential at the first node $ND_1$.

With the foregoing actions, the video signal $V_{Sig\_m}$ is applied to the gate electrode of the driving transistor $TR_D$ with the voltage $V_{CC-H}$ applied from the power supply 100 to one of the source/drain regions of the driving transistor $TR_D$. Therefore, as shown in FIG. 4, the potential at the second node $ND_2$ rises during a period $TP(2)_4$. The magnitude of the rise $\Delta V$ in the potential (potential correction value) will be described later. Assuming that $V_g$ denotes the potential at the gate electrode of the driving transistor $TR_D$ (first node $ND_1$), and $V_s$ denotes the potential in the other source/drain region thereof (second node $ND_2$), as long as the magnitude of the rise $\Delta V$ in the potential at the second node $ND_2$ is not taken into consideration, the $V_g$ and $V_s$ values are expressed by an equation and a statement presented below. The potential difference between the first node $ND_1$ and second node $ND_2$, that is, the potential difference $V_{gs}$ between the gate electrode of the driving transistor $TR_D$ and the other source/drain region thereof acting as a source region is expressed by a statement (A) presented below.

$$V_g = V_{Sig\_m}$$

$$V_s \approx V_{Ofs} - V_{th}$$

$$V_{gs} \approx V_{Sig\_m} - (V_{Ofs} - V_{th}) \quad \text{(A)}$$

Specifically, the potential difference $V_{gs}$ derived from writing processing performed on the driving transistor $TR_D$ depends only on the video signal $V_{Sig\_m}$ based on which the luminance attained by the light emitting section ELP is controlled, the threshold voltage $V_{th}$ of the driving transistor $TR_D$, and the voltage $V_{Ofs}$ with which the potential at the gate electrode of the driving transistor $TR_D$ is initialized. The potential difference $V_{gs}$ has nothing to do with the threshold voltage $V_{th\text{-}EL}$ of the light emitting section ELP.

Next, mobility correcting processing will be described briefly. Along with the foregoing actions, during writing processing, mobility correcting processing is performed to change the potential in the other source/drain region of the driving transistor $TR_D$ (that is, the potential at the second node $ND_2$) according to the property of the driving transistor $TR_D$ (for example, whether the mobility μ is large or small).

As mentioned above, the video signal $V_{Sig\_m}$ is applied to the gate electrode of the driving transistor $TR_D$ with the voltage $V_{CC\text{-}H}$ applied from the power supply 100 to one of the source/drain regions of the driving transistor $TR_D$. As shown in FIG. 4, the potential at the second node $ND_2$ rises during the period $TP(2)_4$. As a result, if the mobility μ permitted by the driving transistor $TR_D$ is large, the magnitude of the rise $\Delta V$ (potential correction value) in the potential in the source region of the driving transistor $TR_D$ increases. If the mobility μ permitted by the driving transistor $TR_D$ is small, the magnitude of the rise $\Delta V$ (potential correction value) in the potential in the source region of the driving transistor $TR_D$ decreases. The potential difference $V_{gs}$ between the gate electrode of the driving transistor $TR_D$ and the source region thereof comes to be expressed with a statement (B) presented below in place of the statement (A).

$$V_{gs} \approx V_{Sig\_m} - (V_{Ofs} - V_{th}) - \Delta V \quad \text{(B)}$$

As described later, qualitatively, control should preferably be extended so that as the $V_{Sig\_m}$, value gets smaller, the period $TP(2)_4$ will get longer. JP-A-2008-9198 (patent document 2) has disclosed a constitution in which the trailing edge of the scanning signal is inclined in order to control the length of the period according to the value of a video signal.

Owing to the foregoing actions, threshold-voltage canceling processing, writing processing, and mobility correcting processing are completed. At the beginning of a succeeding period $TP(2)_5$, the writing transistor $TR_W$ is brought to the off state with a scanning signal sent over the scan line SCL in order to float the first node $ND_1$. The voltage $V_{CC\text{-}H}$ is applied from the power supply 100 to one of the source/drain regions (hereinafter, for brevity's sake, may be called a drain region) of the driving transistor $TR_D$. Therefore, as a result, the potential at the second node $ND_2$ rises. The same phenomenon as that occurring in a so-called bootstrap circuit occurs at the gate electrode of the driving transistor $TR_D$, and the potential at the first node $ND_1$ rises. The potential difference $V_{gs}$ between the gate electrode of the driving transistor $TR_D$ and the source region thereof is retained at the value expressed by the statement (B). A current flowing into the light emitting section ELP is a drain current $I_{ds}$ flowing from the drain region of the driving transistor $TR_D$ to the source region thereof. Supposing the driving transistor $TR_D$ ideally acts at a saturation point, the drain current $I_{ds}$ is expressed by an equation (C) presented below. The light emitting section ELP emits light at a luminance consistent with the value of the drain current $I_{ds}$. A coefficient k will be described later.

$$\begin{aligned} I_{ds} &= k \cdot \mu \cdot (V_{gs} - V_{th})^2 \quad \text{(C)} \\ &= k \cdot \mu \cdot (V_{Sig\_m} - V_{Ofs} - \Delta V)^2 \end{aligned}$$

According to the equation (C), the drain current $I_{ds}$ is proportional to the mobility μ. For the driving transistor $TR_D$ permitting a larger mobility μ, the potential correction value $\Delta V$ gets larger. The value of $(V_{Sig\_m\ m} - V_{Ofs} - \Delta V)^2$ in the equation (C) gets smaller. Therefore, a variance in the drain current $I_{ds}$ derived from a variance in the mobility μ permitted by the driving transistor can be compensated.

The actions to be performed in the 2Tr/1C drive circuit that have been briefed previously will be detailed later.

SUMMARY OF THE INVENTION

In a display device, a phenomenon that a luminance attained by display elements connected onto scan lines varies depending on a row due to an adverse effect of, for example, a fabrication process may be observed. In this case, streaky unevenness occurs in a display image on the display device. This poses a problem in that degradation in uniformity of the luminance is invited. For example, when an appropriately corrected video signal is applied to a data line, the uniformity in the luminance of the display device can be improved. However, the configuration of the display device and a driving method may become complex.

Thus, there is a need for a display device in which the luminance characteristic of display devices connected onto scan lines can be readily adjusted in units of a row, and a driving method for the display device.

According to an embodiment of the present invention, there is provided a display device including:

(1) a scan circuit;
(2) a signal output circuit;
(3) display elements which are arrayed in the form of a two-dimensional matrix having a total of N×M display elements, that is, having N display elements juxtaposed in a first direction and M display elements juxtaposed in a second direction different from the first direction, and each of which includes a current-driven light emitting section and a drive circuit;
(4) M scan lines coupled to the scan circuit and extended in the first direction;
(5) N data lines coupled to the signal output circuit and extended in the second direction; and
(6) a power supply.

The drive circuit includes a writing transistor, a driving transistor, and a capacitor.

In a display element located in the m-th row (where m denotes 1, 2, etc., or M) and the n-th column (where n denotes 1, 2, etc., or N), (A-1) one of the source/drain regions of the driving transistor is connected to the power supply, (A-2) the other source/drain region of the driving transistor is connected to an anode included in the light emitting section, and also connected to one of the electrodes of the capacitor in order to thus form a second node, (A-3) the gate electrode of the driving transistor is connected to the other source/drain region of the writing transistor, and also connected to the other electrode of the capacitor in order to thus form a first node, (B-1) one of the source/drain regions of the writing transistor is connected onto the n-th data line, and (B-2) the gate electrode of the writing transistor is connected onto the m-th scan line.

According to the embodiment of the present invention, there is provided the driving method for the display device including a writing processing step of applying a video signal to the first node over the data line via the writing transistor with a predetermined driving voltage applied from the power supply to one of the source/drain regions of the driving transistor. At the writing processing step, the trailing edge of a scanning signal to be applied to the gate electrode of the writing transistor is inclined. The crest value of the scanning signal to be applied to the first to M-th scan lines is controlled for each scan line, whereby the luminance characteristic of the display elements connected onto each of the scan lines is controlled.

In a display device according to another embodiment of the present invention, a video signal is applied to the first node over the data line via the writing transistor with a predetermined driving voltage applied from the power supply to one of the source/drain regions of the driving transistor. The trailing edge of the scanning signal is inclined. The crest value of the scanning signal to be applied to the first to M-th scan lines is controlled for each scan line.

In the drive circuit included in the display element, the potential at the second node rises at the writing processing step. The degree of the rise in the potential at the second node depends on the length of the period during which the writing processing is carried out. The larger the rise in the potential at the second node is, the smaller a current flowing through the light emitting section is. By adjusting the crest value of the scanning signal, which is applied to the scan lines, for each scan line, the length of the period during which the writing processing is carried out can be adjusted for each scan line. Accordingly, the luminance characteristic of the display elements connected onto each of the scan lines can be readily adjusted in units of a row. In the display device according to the embodiment of the present invention, an image that is superior in the uniformity of the luminance can be displayed.

BRIEF DESCRIPTION OF THE DRAWINGS

FIGS. 5A to 5F are diagrams illustratively showing the on or off states of transistors constituting the drive circuit of the display element;

FIGS. 6A and 6B are diagrams succeeding FIG. 5F and illustratively showing the on or off states of the transistors constituting the drive circuit of the display element;

FIG. 8 is an illustrative diagram for use in explaining the relationship among the potential on a data line, the potential on a scan line, the state of the driving transistor, the potential at a first node, and the potential at the second node which are attained during a horizontal scanning period $H_m$ including a period $TP(2)_4$ shown in FIG. 4;

FIG. 9 is an illustrative circuit diagram for use in explaining the configuration of a scan circuit;

DESCRIPTION OF THE PREFERRED EMBODIMENTS

Figure 1:
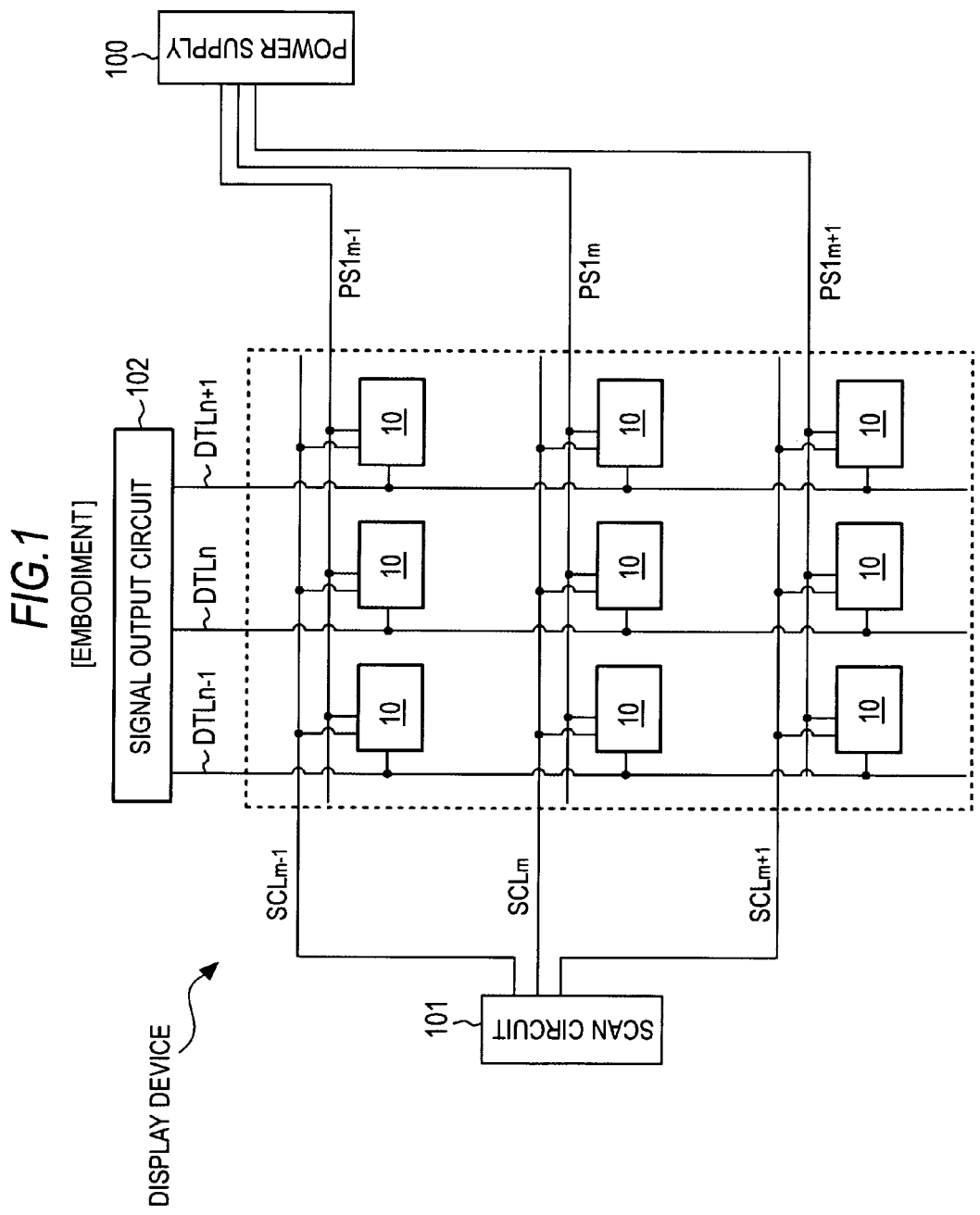
FIG. 1 is a conceptual diagram of a display device.

Referring to the drawings, an embodiment of the present invention will be described below. A description will be made in order as follows.

1. Detailing a display device in accordance with an embodiment of the present invention, and a driving method for the display device 2. Outlining the display device employed as the embodiment 3. Preferred embodiment (a form employing a 2Tr/1C drive circuit)

(Detailing a Display Device in Accordance with an Embodiment of the Present Invention and a Driving Method for the Display Device)

In a display device in accordance with an embodiment of the present invention and a driving method for the display device (hereinafter, may generically called the embodiment of the present invention), a scan circuit includes level shift circuits associated with scan lines. The scan lines are coupled to the output sides of the level shift circuits. By controlling a voltage to be applied to each of the level shift circuits, the crest value of a scanning signal to be outputted from the output side of the level shift circuit is controlled.

In the driving method for the embodiment of the present invention having various preferred components, the trailing edge of the scanning signal to be applied to a gate electrode of a writing transistor at a writing processing step is inclined. A period during which a video signal is applied to a first node over a data line at the writing processing step is adjusted so that when the value of the video signal is smaller, the end of the period will come later. The shape of the trailing edge of the scanning signal may fundamentally be determined according to the designs of a display element and the display device, and may be linear or curved. Preferably, the trailing edge of the scanning signal has a large slope in an initial stage of the fall and has a small slope in a later stage thereof, though it depends on the configuration of the display element. The shape of the trailing edge of the scanning signal can be controlled by, for example, modulating a voltage to be fed to the scan circuit.

In the embodiment of the present invention having various preferred components, pre-processing is performed to initialize the potential at the first node and the potential at a second node for fear the potential difference between the first and second nodes may exceed a threshold voltage of a driving transistor and the potential difference between the second node and a cathode included in a light emitting section may exceed a threshold voltage of the light emitting section. Thereafter, threshold-voltage canceling processing is performed to change the potential at the second node toward a potential, which is obtained by subtracting the threshold voltage of the driving transistor from the potential at the first node, with the potential at the first node held intact. Thereafter, the writing processing is carried out. Thereafter, the writing transistor is brought to an off state with the scanning signal, which is sent over a scan line, in order to float the first node. When a predetermined driving voltage is applied from a power supply to one of the source/drain regions of the driving transistor, a current consistent with the value of the potential difference between the first and second nodes is fed to the light emitting section via the driving transistor in order to drive the light emitting section.

In the embodiment of the present invention having the various preferred components, a current-driven light emitting section that emits light responsively to inflow of a current may be widely adopted as the light emitting section included in the display element. As the light emitting section, an organic electroluminescent light emitting section, an inorganic electroluminescent light emitting section, an LED light emitting section, and a semiconductor laser light emitting section are conceivable. The light emitting sections can be constructed using a known material and method. For constructing a color-display flat display device, the light emitting section is preferably realized with the organic electroluminescent light emitting section. The organic electroluminescent light emitting section may be of a so-called upward lighting type or a downward lighting type.

The display device may be constructed as a so-called monochrome display or a color display. For example, the display device may be constructed as the color display in which one pixel includes plural sub-pixels, or more particularly, three sub-pixels of a red luminous sub-pixel, a green luminous sub-pixel, and a blue luminous sub-pixel. Further, a set of sub-pixels having one kind of sub-pixel or plural kinds of sub-pixels added to the three kinds of sub-pixels (for example, a set of sub-pixels having a sub-pixel, which emits white light, added for the purpose of improving a luminance, a set of sub-pixels having a sub-pixel, which emits complementary color light, added for the purpose of expanding a color reproducible range, a set of sub-pixels having a sub-pixel, which emits yellow light, added for the purpose of expanding the color reproducible range, or a set of sub-pixels having sub-pixels, which emit yellow light and cyan light, added for the purpose of expanding the color reproducible range) may be used to realize one pixel.

As the standards stipulating resolutions based on which the number of values to be represented by each of pixels in the display device is determined, the VGA (a resolution of 640×480), the S-VGA (a resolution of 800×600), the XGA (a resolution of 1024×768), the APRC (a resolution of 1152×900), the S-XGA (a resolution of 1280×1024), the U-XGA (a resolution of 1600×1200), the HDTV (a resolution of 1920×1080), and the Q-XGA (a resolution of 2048×1536) are taken for instance. In addition, other image display resolutions including a resolution of 1920×1035, a resolution of 720×480 and a resolution of 1280×960 can be introduced. However, the number of values to be represented by each pixel is not limited to the numbers of values determined based on these resolutions.

The configuration of a level shift circuit included in the scan circuit is not limited to any specific one. A widely known level shift circuit may be adopted. The level shift circuit may have a configuration in which the scanning signal is generated by, for example, applying an output of a shift register to the input side of the level shift circuit. The configurations or structures of various circuits that include a signal output circuit and constitute the display device, various wirings including the scan lines and data lines, the power supply, and the light emitting sections may be known configurations or structures. For example, the light emitting section is realized with an organic electroluminescent light emitting section, it can be structured to have an anode, a hole transport layer, a luminous layer, an electron transport layer, and a cathode.

As a transistor included in the drive circuit, an n-channel thin film transistor (TFT) is taken for instance. The transistor included in the drive circuit may be of an enhancement type or a depletion type. The n-channel transistor may have a lightly doped drain (LLD) structure formed therein. In some cases, the LLD structure may be formed asymmetrically. For example, when a display element emits light, since a large current flows into a driving transistor, the LDD structure may be formed on the side of one of the source/drain regions of the driving transistor which acts as the drain region during light emission.

A capacitor included in the drive circuit may include one electrode, the other electrode, and a dielectric layer (insulating layer) sandwiched between the electrodes. The transistor and capacitor included in the drive circuit are formed on a certain plane (for example, on a base material). The light emitting section is formed, for example, above the transistor and capacitor, which are included in the drive circuit, via an interlayer insulator. The other source/drain region of the driving transistor is connected to the anode, which is included in the light emitting section, via, for example, a contact hole. The transistor may be formed in a semiconductor substrate.

Referring to the drawings, the present invention will be described by taking the embodiment for instance. Prior to the description, a display device employed as the embodiment will be outlined below.

(Outlining a Display Device Employed as the Embodiment)

A display device suitable for usage the embodiment is intended is a display device including plural pixels. One pixel includes plural sub-pixels (in the embodiment, three sub-pixels of a red luminous sub-pixel, a green luminous sub-pixel, and a blue luminous sub-pixel). A light emitting section is realized with an organic electroluminescent light emitting section. Each of the sub-pixels is formed with a display element 10 that is structured to have a drive circuit 11 and the light emitting section (light emitting section ELP), which is connected to the drive circuit 11, layered.

Figure 2:
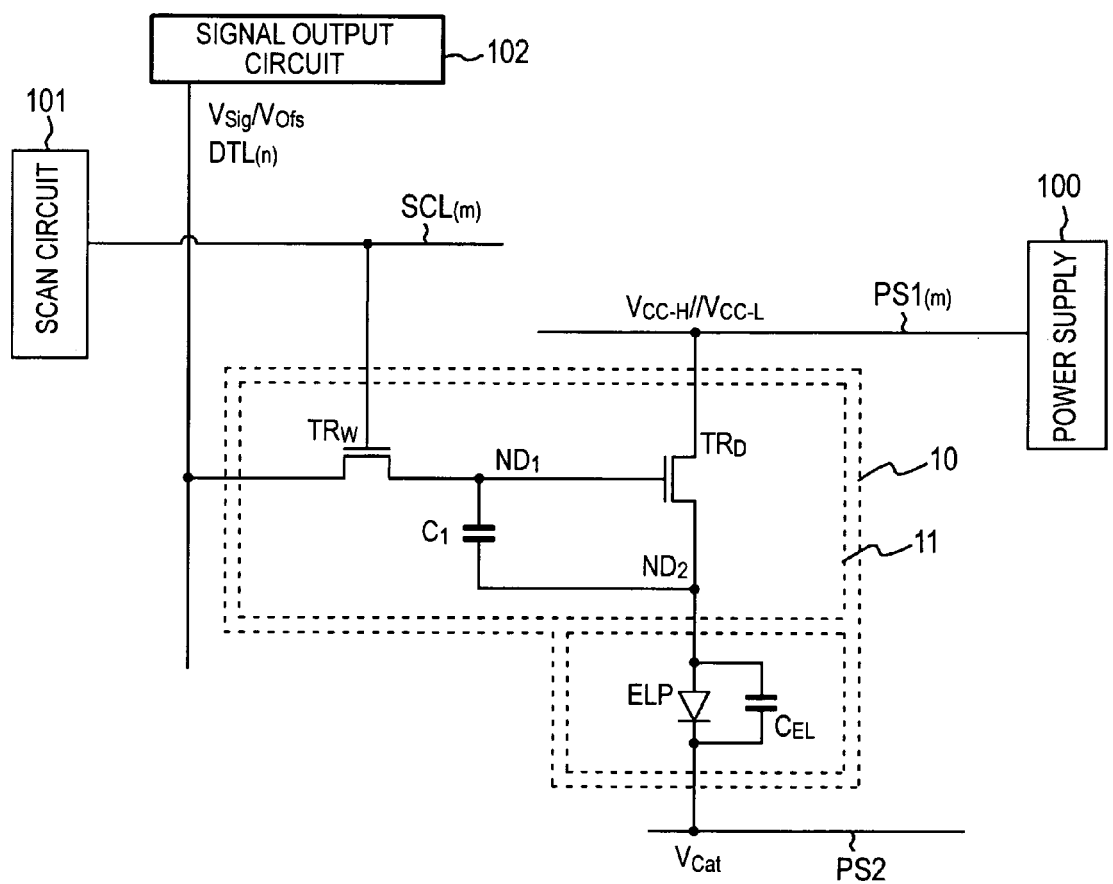
FIG. 2 is a diagram showing an equivalent circuit of a display element including a drive circuit.

FIG. 1 is a conceptual diagram of the display device in accordance with the embodiment. FIG. 2 shows a drive circuit basically including two transistors and one capacitor (hereinafter, may be called as a 2Tr/1C drive circuit).

The display device in accordance with the embodiment includes:

(1) a scan circuit 101;

(2) a signal output circuit 102;

(3) display elements 10 which are arrayed in the form of a two-dimensional matrix having a total of N×M display elements, that is, having N display elements juxtaposed in a first direction and M display elements juxtaposed in a second direction different from the first direction, and each of which includes a light emitting section ELP and a drive circuit 11 that drives the light emitting section ELP;

(4) M scan lines SCL coupled to the scan circuit 101 and extended in the first direction;

(5) N data lines DTL coupled to the signal output circuit 102 and extended in the second direction; and (6) a power supply 100.

FIG. 1 shows 3×3 display elements 10. This is a mere example. For brevity's sake, a power feed line PS2 shown in FIG. 2 is not shown in FIG. 1.

The light emitting section ELP has a known construction or structure including, for example, an anode, a hole transport layer, a luminous layer, an electron transport layer, and a cathode. The configurations or structures of the signal output circuit 102, scan lines SCL, data lines DTL, and power supply 100 are known configurations or structures.

Minimum components of the drive circuit 11 will be described below. The drive circuit 11 includes at least a driving transistor $TR_D$, a writing transistor $TR_W$, and a capacitor $C_1$ having a pair of electrodes. The driving transistor $TR_D$ is realized with an n-channel TFT having source/drain regions, a channel formation region, and a gate electrode. The writing transistor $TR_W$ is also realized with the n-channel TFT having source/drain regions, a channel formation region, and a gate electrode.

In the driving transistor $TR_D$, (A-1) one of the source/drain regions is connected to the power supply 100, (A-2) the other source/drain region is connected to the anode included in the light emitting section ELP, and also connected to one of the electrodes of the capacitor $C_1$ in order to thus form a second node $ND_2$, (A-3) the gate electrode is connected to the other source/drain region of the writing transistor $TR_W$, and also connected to the other electrode of the capacitor $C_1$ in order to thus form a first node $ND_1$.

In the writing transistor $TR_W$, (B-1) one of the source/drain regions is connected onto the data line DTL, and (B-2) the gate electrode is connected onto the scan line SCL.

Figure 3:
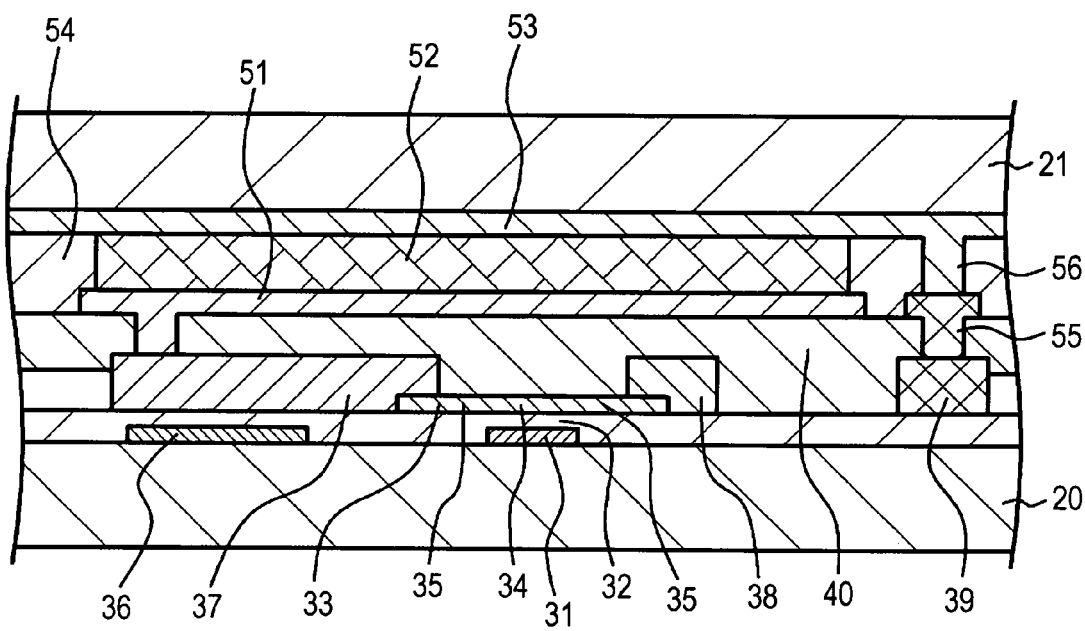
FIG. 3 is a partially sectional view illustratively showing part of the display device.

FIG. 3 shows a partially sectional view illustratively showing part of the display device. The transistors $TR_D$ and $TR_W$ and capacitor $C_1$ included in the drive circuit 11 are formed on a base material 20, and the light emitting section ELP is formed above the transistors $TR_D$ and $TR_W$ and capacitor $C_1$, which are included in the drive circuit 11, via an interlayer insulator 40. The other source/drain region of the driving transistor $TR_D$ is connected to the anode, which is included in the light emitting section ELP, via a contact hole. In FIG. 3, the driving transistor $TR_D$ alone is shown. Other transistors are hidden behind the driving transistor and invisible.

More particularly, the driving transistor $TR_D$ includes a gate electrode 31, a gate insulating layer 32, source/drain regions 35 defined in a semiconductor layer 33, and a channel formation region 34 that is a portion of the semiconductor layer interposed between the source/drain regions 35. The capacitor $C_1$ includes the other electrode 36, a dielectric layer formed with an extension of the gate insulating layer 32, and one electrode 37 (equivalent to the second node $ND_2$). The gate electrode 31, part of the gate insulating layer 32, and the other electrode 36 included in the capacitor $C_1$ are formed on the base material 20. One of the source/drain regions 35 of the driving transistor $TR_D$ is connected to a wiring 38, and the other source/drain region 35 is connected to the one electrode 37. The driving transistor $TR_D$ and capacitor $C_1$ are covered with the interlayer insulator 40. The light emitting section ELP including the anode 51, hole transport layer, luminous layer, electron transport layer, and cathode 53 is disposed on the interlayer insulator 40. In the drawing, the hole transport layer, luminous layer, and electron transport layer are shown as one layer 52. A second interlayer insulator 54 is disposed on a portion of the interlayer insulator 40 on which the light emitting section ELP is not disposed. A transparent substrate 21 is disposed on the second interlayer insulator 54 and cathode 53. Light generated by the luminous layer is emitted to outside through the substrate 21. The one electrode 37 (second node $ND_2$) and the anode 51 are connected to each other through a contact hole formed in the interlayer insulator 40. The cathode 53 is connected to a wiring 39, which is formed on an extension of the gate insulating layer 32, via contact holes 56 and 55 formed in the second interlayer insulator 54 and interlayer insulator 40 respectively.

A fabrication method for the display device shown in FIG. 3 will be described below. To begin with, various wirings including the scan lines SCL, the electrodes included in the capacitors $C_1$, the transistors formed with the semiconductor layer, the interlayer insulators, and the contact holes are formed according to a known method. Thereafter, film formation and patterning are carried out according to known methods in order to form the light emitting sections ELP arrayed in the form of a matrix. The base material 20 having undergone these steps and the substrate 21 are opposed to each other. After the perimeters of the base material 20 and substrate 21 are sealed, they are connected to external circuits. This results in the display device.

The display device in accordance with the embodiment is a display device for color display including plural display elements 10 (for example, N×M=1902×480). Each of the display elements 10 forms a sub-pixel, and one pixel is formed with a group of sub-pixels. The pixels are arrayed in the form of a two-dimensional matrix in a first direction and a second direction different from the first direction. One pixel includes three kinds of sub-pixels juxtaposed in a direction in which the scan lines SCL are extended, that is, a red luminous sub-pixel that emits red light, a green luminous sub-pixel that emits green light, and a blue luminous sub-pixel that emits blue light.

The display device has the (N/3)×M pixels arrayed in the form of a two-dimensional matrix. The display elements 10 forming the pixels are line-sequentially scanned. A display frame rate FR is expressed as the number of times per second. Namely, the display elements 10 forming (N/3) pixels (N sub-pixels) juxtaposed in the m-th row (where m denotes 1, 2, 3, etc., or M) are driven at the same time. In other words, the display elements 10 constituting one row have the light emitting/non-light emitting timing thereof controlled in units of a row. Processing of writing a video signal for each of the pixels juxtaposed in one row is regarded as processing of writing the video signal simultaneously for all the pixels.

As mentioned above, the display elements 10 in the first to m-th rows are line-sequentially scanned. For brevity's sake, a period during which the display elements 10 in each row are scanned shall be called a horizontal scanning period. In an example to be described later, each horizontal scanning period includes a period during which a first-node initialization voltage ($V_{Ofs}$ to be described later) is applied from the signal output circuit 102 to the data line DTL (hereinafter, called an initialization period), and a period during which a video signal ($V_{Sig}$ to be described later) is applied from the signal output circuit 102 to the data line DTL (hereinafter, called a video signal period).

Now, a description will be made of driving of the display element 10 located in the m-th row and the n-th column (where n denotes 1, 2, 3, etc., or N), and the action thereof. In principle, the display element 10 shall be called the (n,m)-th display element 10 or the (n,m)-th sub-pixel. Various kinds of pieces of processing (threshold voltage canceling processing, writing processing, and mobility correcting processing to be described later) are carried out until the end of the horizontal scanning period for the display elements 10 juxtaposed in the m-th row (the m-th horizontal scanning period). The writing processing and mobility correcting processing are performed within the m-th horizontal scanning period. Depending on the type of drive circuit, the threshold-voltage canceling processing and accompanying pre-processing may be performed at a time point preceding the m-th horizontal scanning period.

After the foregoing various kinds of pieces of processing are all completed, the light emitting sections ELP of the display elements 10 juxtaposed in the m-th row are allowed to emit light. After the foregoing various kinds of pieces of processing are all completed, the light emitting sections ELP may immediately be allowed to emit light, or may be allowed to emit light after the elapse of a predetermined period (for example, horizontal scanning periods for a predetermined number of rows). The predetermined period may be designated appropriately according to the specifications for the display device or the configuration of the drive circuit. Hereinafter, for brevity's sake, the light emitting sections ELP shall be allowed to emit light immediately after the completion of the various kinds of pieces of processing. The luminous states of the light emitting sections ELP included in the respective display elements 10 juxtaposed in the m-th row are held intact until a time point immediately preceding the beginning of a horizontal scanning period for the display elements 10 juxtaposed in the (m+m')-th row. Herein, the m' value is determined based on the design specifications for the display device. Namely, light emission made for a certain display frame by the light emitting sections ELP included in the respective display elements 10 juxtaposed in the m-th row is continued until the (m+m'-1)-th horizontal scanning period. In principle, the light emitting sections ELP included in the respective display elements 10 juxtaposed in the m-th row are retained in a non-luminous state from the beginning of the (m+m')-th horizontal scanning period until the completion of writing processing and mobility correcting processing within the m-th horizontal scanning period in the next display frame. Since the period during which the light emitting sections are retained in the non-luminous state (hereinafter, may be called a non-luminous period) is defined, an after-image blur caused by active matrix driving is minimized and motion-picture definition is upgraded. However, the luminous state/non-luminous state of each sub-pixel (display element 10) is not limited to the foregoing one. The time length of the horizontal scanning period is a time length falling below $(1/FR)\times(1/M)$ sec. If the (m+m') value exceed the M value, an excessive portion of the horizontal scanning period is used for the next display frame.

Out of the two source/drain regions included in one transistor, the term "one of the source/drain regions or one source/drain region" may be used to indicate a source/drain region connected to the power supply. When it says that a transistor is put or brought to an on state, it means that a channel is formed between the source/drain regions. However, whether a current flows from one of the source/drain regions of the transistor to the other source/drain region does not count. In contrast, when it says that a transistor is put or brought to an off state, it means that a channel is not formed between the source/drain regions. When it says that a source/drain region of a certain transistor is connected to a source/drain region of another transistor, it encompasses a state in which the source/drain region of the certain transistor and the source/drain region of another transistor occupy the same region. Further, the source/drain regions may be not only made of a conductive material such as polysilicon containing an impurity or amorphous silicon but also formed with a layer having a laminated structure of a metal, an alloy, and conducting grains, or a layer made of an organic material (a conductive high polymer). In timing charts to be used later for explanation, a length (time length) on the axis of abscissas indicating a period is illustratively determined but does not express a ratio of the time length of each period to the total time length. The same applies to the axis of ordinates. The shapes of waves in the timing charts are also illustratively determined.

Now, the present invention will be described based on a preferred embodiment.

The preferred embodiment relates to the display device in accordance with the embodiment of the present invention, and the driving method for the display device. In the preferred embodiment, the drive circuit 11 includes two transistors and one capacitor. FIG. 2 shows an equivalent circuit of the display element 10 including the drive circuit 11.

To begin with, the drive circuit and light emitting section will be detailed below.

The drive circuit 11 includes two transistors of a writing transistor $TR_W$ and a driving transistor $TR_D$, and further includes one capacitor $C_1$ (2Tr/1C drive circuit).

[Driving Transistor $TR_D$]

One of the source/drain regions of the driving transistor $TR_D$ is connected to the power supply 100 over a power feed line PS1, while the other source/drain region of the driving transistor $TR_D$ is connected to both of:

[1] the anode of the light emitting section ELP; and

[2] one of the electrodes of the capacitor $C_1$. Thus, the second node $ND_2$ is formed. The gate electrode of the driving transistor $TR_D$ is connected to both of:

[1] the other source/drain region of the writing transistor $TR_W$; and

[2] the other electrode of the capacitor $C_1$.

Thus, the first node $ND_1$ is formed. A voltage $V_{CC-H}$ and a voltage $V_{CC-L}$, are, as described later, fed from the power supply 100.

Now, the driving transistor $TR_D$ is driven to feed a drain current $I_{ds}$ according to an equation (1) presented below. When the display element 10 is put to a luminous state, one of the source/drain regions of the driving transistor $TR_D$ acts as a drain region, and the other source/drain region thereof acts as a source region. For brevity's sake, one of the source/drain regions of the driving transistor $TR_D$ may be simply called the drain region, and the other source/drain region thereof may be simply called the source region. Assuming that μ denotes an effective mobility, L denotes a channel length, W denotes a channel width, $V_{gs}$ denotes the potential difference between the gate electrode and source region, $V_{th}$ denotes a threshold voltage, $C_{OX}$ denotes (the relative dielectric constant of the gate insulating layer)×(the dielectric constant in the vacuum)/(the thickness of the gate insulating layer), and $k \equiv (\frac{1}{2}) \cdot (W/L) \cdot C_{OX}$ is established, the drain current $I_{ds}$ is expressed as follows:

$$I_{ds} = k \cdot \mu \cdot (V_{gs} - V_{th})^2 \quad (1)$$

When the drain current $I_{ds}$ flows into the light emitting section ELP of the display element 10, the light emitting section ELP of the display element 10 emits light. The luminous state (luminance) of the light emitting section ELP of the display element 10 is controlled based on whether the value of the drain current $I_{ds}$ is large.

[Writing Transistor $TR_W$]

The other source/drain region of the writing transistor $TR_W$ is, as mentioned above, connected to the gate electrode of the driving transistor $TR_D$. One of the source/drain regions of the writing transistor $TR_W$ is connected to the data line DTL. A video signal (a driving signal and a luminance signal) $V_{Sig}$ based on which the luminance to be attained by the light emitting element ELP is controlled is fed to the one source/drain region over the data line DTL from the signal output circuit 102. A first-node initialization voltage $V_{Ofs}$ is fed to the one source/drain region over the data line DTL. The going-on/off action of the writing transistor $TR_W$ is controlled with a scanning signal sent over the scan line SCL coupled to the gate electrode of the writing transistor $TR_W$, or more particularly, with the scanning signal sent from the scan circuit 101.

[Light Emitting Section ELP]

The anode of the light emitting section ELP is, as mentioned above, connected to the source region of the driving transistor $TR_D$, while the cathode of the light emitting section ELP is connected onto the power feed line PS2 to which a voltage $V_{Cat}$ to be described later is applied. $C_{EL}$ denotes the parasitic capacitor of the light emitting section ELP, and $V_{th-EL}$ denotes a threshold voltage necessary for the light emitting section ELP to emit light. When a voltage higher than the threshold voltage $V_{th-EL}$ is applied between the anode and cathode included in the light emitting section ELP, the light emitting section ELP emits light.

Next, the display device of the preferred embodiment and the driving method for the display device will be described below.

For a description to be made below, the symbols presented below denote voltages or potentials. The values of the voltages and potentials are presented for the purpose of explanation. The voltages and potentials shall not be limited to the values.

$V_{Sig}$: a video signal based on which a luminance to be attained by the light emitting section ELP is controlled.
 1 V (black display) to 8 V (white display)

$V_{CC-H}$: a driving voltage that causes a current to flow into the light emitting section ELP.
 20 V $V_{CC-L}$: a second-node initialization voltage.
 −10 V $V_{Ofs}$: a first-node initialization voltage with which the potential at the gate electrode of the driving transistor $TR_D$ (potential at the first node $ND_1$) is initialized.
 0 V $V_{th}$: a threshold voltage of the driving transistor $TR_D$.
 3 V $V_{Cat}$: a voltage to be applied to the cathode of the light emitting section ELP.

$V_{th-EL}$: a threshold voltage of the light emitting section ELP.
 3 V

In the display device of the preferred embodiment, the video signal $V_{Sig}$ is applied to the first node $ND_1$ over the data line DTL via the writing transistor $TR_W$ with the predetermined driving voltage $V_{CC-H}$ applied from the power supply 100 to one of the source/drain regions of the driving transistor $TR_D$. The trailing edge of the scanning signal is inclined, and the crest value of the scanning signal to be applied to the first to M-th scan lines SCL is controlled for each of the scan lines SCL.

The driving method for the display device of the preferred embodiment (hereinafter, simply called the driving method) includes a writing processing step of applying the video signal $V_{Sig}$ to the first node $ND_1$ over the data line DTL via the writing transistor $TR_W$ with the predetermined driving voltage $V_{CC-H}$ applied from the power supply 100 to one of the source/drain regions of the driving transistor $TR_D$. At the writing processing step, the trailing edge of the scanning signal to be applied to the gate electrode of the writing transistor $TR_W$ is inclined. By controlling the crest value of the scanning signal, which is applied to the first to M-th scan lines SCL, for each of the scan lines SCL, the luminance characteristic of the display elements connected onto each of the scan lines SCL are controlled.

As shown in FIG. 9 to be referenced later, the scan circuit 101 includes level shift circuits 101B associated with the scan lines SCL. The scan lines SCL are coupled to the output sides of the level shift circuits 101B. By controlling a voltage to be applied to each of the level shift circuits 101B, the crest value of the scanning signal to be outputted from the output side of the level shift circuit 101B is controlled.

Figure 4:
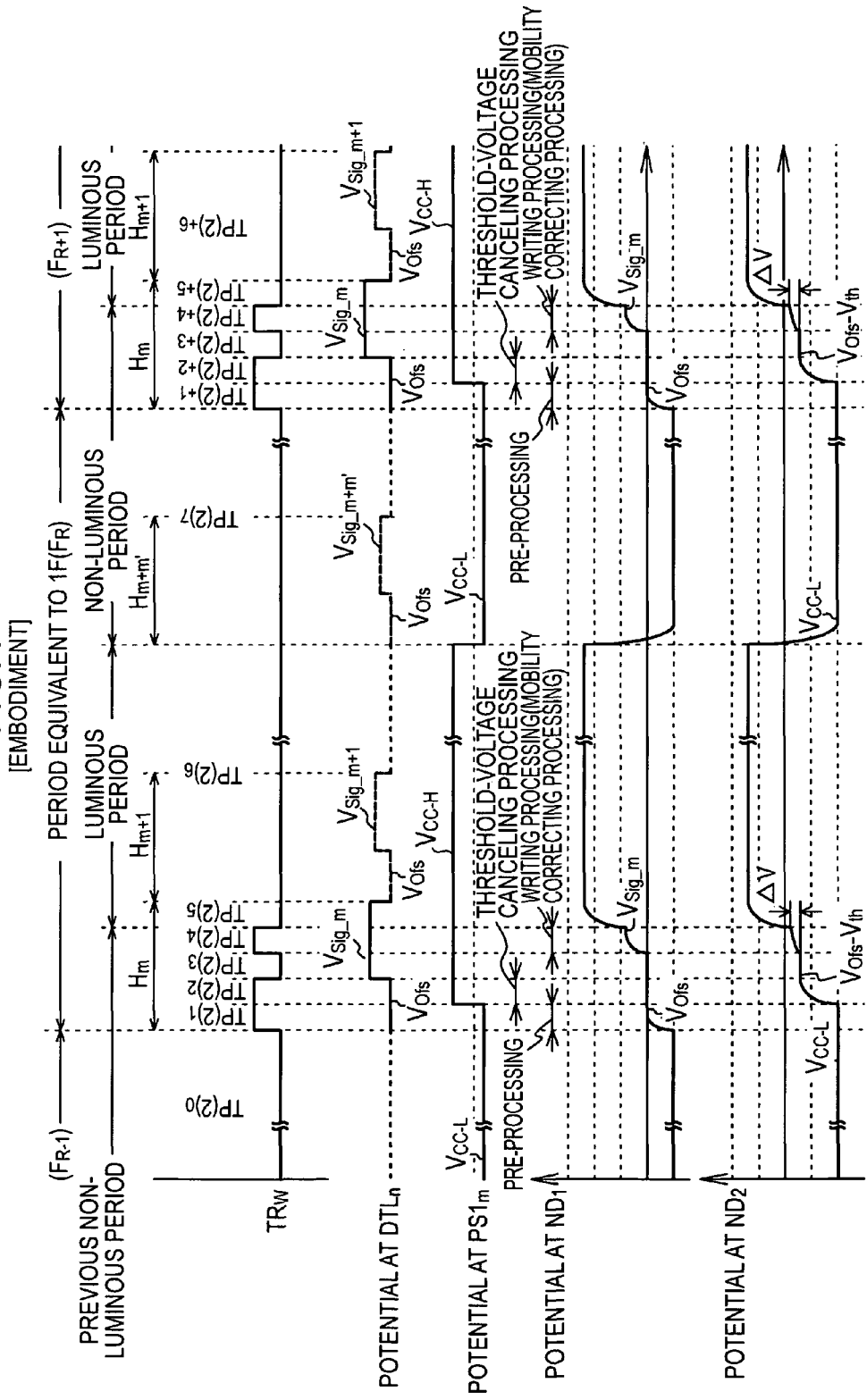
FIG. 4 is a diagram illustratively showing a timing chart concerning driving of the display element in accordance with a preferred embodiment.

Actions to be performed according to the driving method of the preferred embodiment will be described below. For brevity's sake, the actions will be described on the assumption that the crest value of the scanning signal to be applied to the scan lines SCL remains constant. FIG. 4 illustratively shows a timing chart concerning driving of the display elements 10 included in the preferred embodiment. FIGS. 5A to 5F and FIGS. 6A and 6B illustratively show the on/off states of the transistors included in the display element 10.

Referring to FIG. 4, FIGS. 5A to 5F, and FIGS. 6A and 6B, the driving method of the preferred embodiment will be described below. The driving method of the preferred embodiment includes the steps of:

(a) performing pre-processing (to initialize the potential at the first node $ND_1$ and the potential at the second node $ND_2$ for fear the potential difference between the first node $ND_1$ and second node $ND_2$ may exceed the threshold voltage $V_{th}$ of the driving transistor $TR_D$ and the potential difference between the second node $ND_2$ and the cathode included in the light emitting section ELP may exceed the threshold voltage $V_{th-EL}$ of the light emitting section ELP;

(b) performing threshold-voltage canceling processing to change the potential at the second node $ND_2$ toward a potential, which is obtained by subtracting the threshold voltage $V_{th}$ of the driving transistor $TR_D$ from the potential at the first node $ND_1$, with the potential at the first node $ND_1$ held intact;

(c) performing writing processing to apply the video signal $V_{Sig}$ to the first node $ND_1$ over the data line DTL via the writing transistor $TR_W$ with the predetermined driving voltage $V_{CC-H}$ applied from the power supply 100 to one of the source/drain regions of the driving transistor $TR_D$; and (d) floating the first node $ND_1$ by putting the writing transistor $TR_W$ to an off state with the scanning signal sent over the scan line SCL, and driving the light emitting section ELP by feeding a current, which is consistent with the value of the potential difference between the first node $ND_1$ and second node $ND_2$, to the light emitting section ELP via the driving transistor $TR_D$, with a predetermined driving voltage $V_{CC-H}$ applied from the power supply 100 to one of the source/drain regions of the driving transistor $TR_D$.

Periods $TP(2)_0$ to $TP(2)_3$ shown in FIG. 4 constitute an action period immediately preceding a period $TP(2)_4$ during which writing processing is performed. During the periods $TP(2)_0$ to $TP(2)_3$, the (n,m)-th display element 10 is, in principle, retained in a non-luminous state. As shown in FIG. 4, in addition to the periods $TP(2)_4$ and $TP(2)_5$, the periods $TP(2)_1$ to $TP(2)_3$ are included in the m-th horizontal scanning period $H_m$.

For brevity's sake, the beginning of the period $TP(2)_1$ shall correspond to the beginning of an initialization period included in the m-th horizontal scanning period $H_m$ (in FIG. 4, a period during which the potential on the data line DTL corresponds to the voltage $V_{Ofs}$ and which is included in any other horizontal scanning period). Likewise, the end of the period $TP(2)_2$ shall correspond to the end of the initialization period within the horizontal scanning period $H_m$. The beginning of the period $TP(2)_3$ shall correspond to the beginning of a video signal period included in the horizontal scanning period $H_m$ (in FIG. 4, a period during which the potential on the data line DTL corresponds to the voltage $V_{Sig\_m}$ to be described later).

The periods $TP(2)_0$ to $TP(2)_{+6}$ will be described below. The lengths of the periods $TP(2)_1$ to $TP(2)_3$ may be designated appropriately according to the design of the display device.

[Period $TP(2)_o$] (See FIG. 4 and FIG. 5A.)

The period $TP(2)_0$ is a period during which an action is performed in order to make a transition from a previous display frame to a current display frame. Namely, the period $TP(2)_0$ is a period from the beginning of the (m+m')-th horizontal scanning period $H_{m+m'}$ within the previous display frame to the (m−1)-th horizontal scanning period $H_{m-1}$ within the current display frame. During the period $TP(2)_0$, the (n,m)-th display element 10 is held in the non-luminous state. At the beginning of the period $TP(2)_0$ (not shown), the voltage to be fed from the power supply 100 is changed from the driving voltage $V_{CC-H}$ to the second-node initialization voltage $V_{CC-L}$. As a result, the potential at the second node $ND_2$ falls down to the voltage $V_{CC-L}$. A reverse-direction voltage is applied between the anode and cathode of the light emitting section ELP, whereby the light emitting section ELP is brought to the non-luminous state. Along with the fall in the potential at the second node $ND_2$, the potential at the floating first node $ND_1$ (the gate electrode of the driving transistor $TR_D$) falls.

As mentioned above, during each horizontal scanning period, the first-node initialization voltage $V_{Ofs}$ is applied from the signal output circuit 102 to the data line DTL, and the video signal $V_{Sig}$ is then applied in place of the first-node initialization voltage $V_{Ofs}$. More particularly, during the m-th horizontal scanning period $H_m$ within the current display frame, the first-node initialization voltage $V_{Ofs}$ is applied to the data line DTL. Thereafter, a video signal associated with the (n,m)-th sub-pixel (shall be called a video signal $V_{Sig\_m}$, and the same applies to any other video signal) is applied in place of the first-node initialization voltage $V_{Ofs}$. Likewise, during the (m+1)-th horizontal scanning period $H_{m+1}$, the first-node initialization voltage $V_{Ofs}$ is applied to the data line DTL. Thereafter, a video signal $V_{Sig\_m+1}$ associated with the (n,m+1)-th sub-pixel is applied in place of the first-node initialization voltage $V_{Ofs}$. The first-node initialization voltage $V_{Ofs}$ and video signal $V_{Sig}$ are applied to the data line DTL during any horizontal scanning period other than the horizontal scanning periods $H_m$, $H_{m+1}$, and $H_{m+m'}$, though they are not shown in FIG. 4.

[Period $TP(2)_1$] (See FIG. 4 and FIG. 5B.)

The m-th horizontal scanning period $H_m$ within the current display frame then begins. During the period $TP(2)_1$, the aforesaid step (a) is implemented.

More particularly, at the beginning of the period $TP(2)_1$, the potential on the scan line SCL is driven to the high level in order to put the writing transistor $TR_W$ to the on state. A voltage to be applied from the signal output circuit 102 to the data line DTL is the voltage $V_{Ofs}$ (initialization period). As a result, the potential at the first node $ND_1$ becomes equal to the voltage $V_{Ofs}$ (0 V). Since the second-node initialization voltage $V_{CC-L}$ is applied from the power supply 100 to the second node $ND_2$, the potential at the second node $ND_2$ is retained at the voltage $V_{CC-L}$ (10 V).

Since the potential difference between the first node $ND_1$ and second node $ND_2$ is 10 V and the threshold voltage $V_{th}$ of the driving transistor $TR_D$ is 3 V, the driving transistor $TR_D$ is held in the on state. The potential difference between the second node $ND_2$ and the cathode included in the light emitting section ELP is −10 V and does not exceed the threshold voltage $V_{th-EL}$ of the light emitting section ELP. Thus, the pre-processing of initializing the potential at the first node $ND_1$ and the potential at the second node $ND_2$ is completed.

[Period $TP(2)_2$] (See FIG. 4 and FIG. 5C.)

The aforesaid step (b) is implemented during the period $TP(2)_2$.

Specifically, with the writing transistor $TR_W$ held in the on state, a voltage to be fed from the power supply 100 is changed from the voltage $V_{CC-L}$ to the voltage $V_{CC-H}$. As a result, although the potential at the first node $ND_1$ remains unchanged (the voltage $V_{Ofs}$ is retained at 0 V), the potential at the second node $ND_2$ is changed toward a potential obtained by subtracting the threshold voltage $V_{th}$ of the driving transistor $TR_D$ from the potential at the first node $ND_1$. That is, the potential at the floating second node $ND_2$ rises. For brevity's sake, the length of the period $TP(2)_2$ shall be a length long enough to change the potential at the second node $ND_2$.

As long as the period $TP(2)_2$ is sufficiently long, the potential difference between the gate electrode of the driving transistor $TR_D$ and the other source/drain region thereof reaches the voltage $V_{th}$. The driving transistor $TR_D$ is brought to the off state. Namely, the potential at the floating second node $ND_2$ approaches to −3 V (=$V_{Ofs}$−$V_{th}$) and finally becomes equal to the value ($V_{Ofs}$−$V_{th}$). As long as an inequality (2) presented below is guaranteed, or in other words, as long as the potential is selected and determined so that the inequality (2) will be satisfied, the light emitting section ELP will not emit light.

$$(V_{Ofs}-V_{th})<(V_{th-EL}+V_{Cat}) \quad (2)$$

During the period $TP(2)_2$, the potential at the second node $ND_2$ finally becomes equal to the value ($V_{Ofs}$−$V_{th}$). Namely, the potential at the second node $ND_2$ is determined dependently on the threshold voltage $V_{th}$ of the driving transistor $TR_D$ and the voltage $V_{ofs}$ with which the potential at the gate electrode of the driving transistor $TR_D$ is initialized. The potential at the second node $ND_2$ has nothing to do with the threshold voltage $V_{th-EL}$ of the light emitting section ELP.

[Period $TP(2)_3$] (See FIG. 4 and FIG. 5D.)

At the beginning of the period $TP(2)_3$, the writing transistor $TR_W$ is brought to the off state with the scanning signal sent over the scan line SCL. A voltage to be applied to the data line DTL is changed from the first-node initialization voltage $V_{Ofs}$ to the video signal $V_{Sig\_m}$ (video signal period). If the driving transistor $TR_D$ is already put to the off state during threshold-voltage canceling processing, the potentials at the first node $ND_1$ and second node $ND_2$ do not change. If the driving transistor $TR_D$ is not put to the off state during threshold-voltage canceling processing, a bootstrap action arises during the period $TP(2)_3$. The potentials at the first node $ND_1$ and second node $ND_2$ slightly rise.

[Period $TP(2)_4$] (See FIG. 4 and FIG. 5E.)

The aforesaid step (c) is implemented during the period TP $(2)_4$. The writing transistor $TR_W$ is brought to the on state with the scanning signal sent over the scan line SCL. The video signal $V_{Sig\_m}$ is then applied to the first node $ND_1$ over the data line DTL via the writing transistor $TR_W$. As a result, the potential at the first node $ND_1$ rises up to the voltage $V_{Sig\_m}$. The driving transistor $TR_D$ is held in the on state. In some cases, the writing transistor $TR_W$ may be held in the on state during the period TP $(2)_3$. In these cases, as soon as the voltage on the data line DTL is switched from the first-node initialization voltage $V_{Ofs}$ to the video signal $V_{Sig\_m}$ during the period $TP(2)_3$, writing processing is initiated.

The capacitance of the capacitor $C_1$ is a capacitance $c_1$, and the capacitance of the capacitor $C_{EL}$ included in the light emitting section ELP is a capacitance $C_{EL}$. The parasitic capacitor interposed between the gate electrode of the driving transistor $TR_D$ and the other source/drain region thereof has a capacitance $c_{gs}$. When the potential at the gate electrode of the driving transistor $TR_D$ is changed from the voltage $V_{Ofs}$ to the voltage $V_{Sig\_m}$ ($>V_{Ofs}$), the potentials at both the ends of the capacitor $C_1$ (the potentials at the first node $ND_1$ and second node $ND_2$) change in principle. Specifically, a charge consistent with a change ($V_{Sig\_m}-V_{Ofs}$) in the potential at the gate electrode of the driving transistor $TR_D$ (=the potential at the first node $ND_1$) is distributed to the capacitor $C_1$, the capacitor $C_{EL}$ included in the light emitting section ELP, and the parasitic capacitor interposed between the gate electrode of the driving transistor $TR_D$ and the other source/drain region thereof. If the capacitance $c_{EL}$ is much larger than the capacitances $c_1$ and $c_{gs}$, a change in the potential at the other source/drain region (second node $ND_2$) of the driving transistor $TR_D$ derived from the change in the potential at the gate electrode of the driving transistor $TR_D$ ($V_{Sig\_m}-V_{Ofs}$) is limited. In general, the capacitance $c_{EL}$ of the capacitor $C_{EL}$ included in the light emitting section ELP is larger than the capacitance $c_1$ of the capacitor $C_1$ and the capacitance $c_{gs}$ of the parasitic capacitor of the driving transistor $TR_D$. Therefore, in the above description, no consideration is taken into a change in the potential at the second node $ND_2$ derived from the change in the potential at the first node $ND_1$. Unless otherwise mentioned, a description will be made with no consideration taken into the change in the potential at the second node $ND_2$ derived from the change in the potential at the first node $ND_1$. The timing chart for driving is plotted with no consideration taken into the change in the potential at the second node $ND_2$ derived from the change in the potential at the first node $ND_1$.

In the foregoing writing processing, the driving voltage $V_{CC-H}$ is applied from the power supply 100 to one of the source/drain regions of the driving transistor $TR_D$, and the video signal $V_{Sig\_m}$ is then applied to the gate electrode of the driving transistor $TR_D$. Therefore, as shown in FIG. 4, the potential at the second node $ND_2$ rises during the period TP $(2)_4$. The magnitude of the rise in the potential ($\Delta V$ in FIG. 4) will be described later. Assuming that $V_g$ denotes the potential at the gate electrode of the driving transistor $TR_D$ (first node $ND_1$) and $V_s$ denotes the potential in the other source/drain region of the driving transistor $TR_D$ (second node $ND_2$), as long as the rise in the potential at the second node $ND_2$ is not taken into account, the values $V_g$ and $V_s$ are expressed by an equation and a statement presented below. The potential difference between the first node $ND_1$ and second node $ND_2$, that is, the potential difference $V_{gs}$ between the gate electrode of the driving transistor $TR_D$ and the other source/drain region thereof acting as the source region is expressed by a statement (3) presented below.

$$V_g = V_{Sig\_m}$$

$$V_s \approx V_{Ofs} - V_{th}$$

$$V_{gs} \approx V_{Sig\_m} - (V_{Ofs} - V_{th}) \tag{3}$$

Specifically, the potential difference $V_{gs}$ obtained through writing processing performed on the driving transistor $TR_D$ depends on the video signal $V_{Sig\_m}$ based on which a luminance to be attained by the light emitting section ELP is controlled, the threshold voltage $V_{th}$ of the driving transistor $TR_D$, and the voltage $V_{Ofs}$ with which the potential at the gate electrode of the driving transistor $TR_D$ is initialized. The potential difference $V_{gs}$ has nothing to do with the threshold voltage $V_{th-EL}$ of the light emitting section ELP.

Next, the rise in the potential at the second node $ND_2$ occurring during the period $TP(2)_4$ will be described below. According to the driving method of the preferred embodiment, along with writing processing, mobility correcting processing is performed to raise the potential in the other source/drain region of the driving transistor $TR_D$ (that is, the potential at the second node $ND_2$) according to the property of the driving transistor $TR_D$ (for example, whether the mobility $\mu$ is large).

If the driving transistor $TR_D$ is realized with a polysilicon thin-film transistor, it is unavoidable that a variance occurs in the mobility $\mu$ among transistors. Therefore, if the video signal $V_{Sig}$ taking on the same value is applied to the gate electrodes of plural driving transistors $TR_D$ which are different from one another in the mobility $\mu$, there arises a difference between the drain current $I_{ds}$, which flows into the driving transistor $TR_D$ that permits a large mobility $\mu$, and the drain current $I_{ds}$ flowing into the driving transistor $TR_D$ that permits a small mobility $\mu$. When the difference arises, the uniformity on the screen of the display device is impaired.

In the driving method of the preferred embodiment, the driving voltage $V_{CC-H}$ is applied from the power supply 100 to one of the source/drain regions of the driving transistor $TR_D$, and the video signal $V_{Sig\_m}$ is then applied to the gate electrode of the driving transistor $TR_D$. Therefore, as shown in FIG. 4, the potential at the second node $ND_2$ rises during the period $TP(2)_4$. If the mobility $\mu$ permitted by the driving transistor $TR_D$ is large, the magnitude of the rise $\Delta V$ (potential correction value) in the potential in the other source/drain region of the driving transistor $TR_D$ (that is, the potential at the second node $ND_2$) increases. In contrast, if the mobility $\mu$ permitted by the driving transistor $TR_D$ is small, the magnitude of the rise $\Delta V$ (potential correction value) in the potential in the other source/drain region of the driving transistor $TR_D$ decreases. Herein, the potential difference $V_{gs}$ between the gate electrode of the driving transistor $TR_D$ and the other source/drain region thereof acting as the source region is changed from the value signified by the statement (3) to a value signified by a statement (4) presented below.

$$V_g \approx V_{Sig\_m} - (V_{Ofs} - V_{th}) - \Delta V \tag{4}$$

A predetermined time during which writing processing is executed (in FIG. 4, the overall time ($t_0$) of the period $TP(2)_4$) will be described later. The overall time ($t_0$) of the period $TP(2)_4$ shall be determined so that the potential ($V_{Ofs} - V_{th} +$ ΔV) in the other source/drain region of the driving transistor $TR_D$ will satisfy the inequality (2') presented below. The light emitting section ELP will not emit light during the period $TP(2)_4$. During the mobility correcting processing, a variance in the coefficient k ($\equiv (1/2) \cdot (W/L) \cdot C_{OX}$) is compensated concurrently.

$$(V_{Ofs} - V_{th} + \Delta V) < (V_{th-EL} + V_{cat}) \quad (2')$$

[Period $TP(2)_5$] (See FIG. 4 and FIG. 5F.)

Owing to the foregoing actions, the steps (a) to (c) are completed. Thereafter, during the period $TP(2)_5$, the aforesaid step (d) is implemented. Specifically, while the state in which the driving voltage $V_{CC-H}$ is applied from the power supply 100 to one of the source/drain regions of the driving transistor $TR_D$ is sustained, the potential on the scan line SCL is driven to the low level according to the action of the scan circuit 101, the writing transistor $TR_W$ is brought to the off state, and the first node $ND_1$, that is, the gate electrode of the driving transistor $TR_D$ is floated. As a result, the potential at the second node $ND_2$ rises.

As mentioned above, since the gate electrode of the driving transistor $TR_D$ is floated and the capacitor $C_1$ is present, a phenomenon identical to that occurring in a so-called bootstrap circuit occurs in the gate electrode of the driving transistor $TR_D$. The potential at the first node $ND_1$ rises. As a result, the potential difference $V_{gs}$ between the gate electrode of the driving transistor $TR_D$ and the other source/drain region thereof acting as the source region is retained at the value signified by the statement (4).

Since the potential at the second node $ND_2$ rises and exceeds a value ($V_{th-EL} + V_{Cat}$), the light emitting section ELP begins emitting light. At this time, a current flowing into the light emitting section ELP is the drain current $I_{ds}$ that flows from the drain region of the driving transistor $TR_D$ to the source region thereof, the current can be expressed by the equation (1). The equation (1) can be rewritten into an equation (5) presented below in consideration of the statement (4).

$$I_{ds} = k \cdot \mu \cdot (V_{Sig\_m} - V_{Ofs} - \Delta V)^2 \quad (5)$$

Therefore, assuming that the voltage $V_{Ofs}$ is set to 0 V, the current $I_{ds}$ flowing into the light emitting section ELP is proportional to the square of a value obtained by subtracting the potential correction value ΔV, which is attributable to the mobility μ permitted by the driving transistor $TR_D$, from the value of the video signal $V_{Sig\_m}$ based on which the luminance to be attained by the light emitting section ELP is controlled. In other words, the current $I_{ds}$ flowing into the light emitting section ELP depends on neither the threshold voltage $V_{th-EL}$ of the light emitting section ELP nor the threshold voltage $V_{th}$ of the driving transistor $TR_D$. Namely, the amount of light (luminance) emitted from the light emitting section ELP is unsusceptible to both the threshold voltage $V_{th-EL}$ of the light emitting section ELP and the threshold voltage $V_{th}$ of the driving transistor $TR_D$. The luminance attained by the (n,m)-th display element 10 is consistent with the current $I_{ds}$.

The larger the mobility μ permitted by the driving transistor $TR_D$ is, the larger the potential correction value ΔV is. Therefore, the $V_{gs}$ value in the statement (4) gets smaller. According to the equation (5), even when the mobility μ is large, the $(V_{Sig\_m} - V_{Ofs} - \Delta V)^2$ value decreases. As a result, a variance in the drain current $I_{ds}$ derived from a variance in the mobility μ permitted by the driving transistor $TR_D$ (further, a variance in k) can be compensated. Thus, a variance in the luminance attained by the light emitting section ELP which is derived from the variance in the mobility μ can be compensated.

The luminous state of the light emitting section ELP is continued until the (m+m'−1)-th horizontal scanning period. The end of the (m+m'−1)-th horizontal scanning period corresponds to the end of the period $TP(2)_6$. Herein, m' denotes a predetermined value that meets the relationship of 1<m'<M and is specific to the display device. In short, the light emitting section ELP is kept driven during a period from the beginning of the period $TP(2)_5$ to a time point immediately preceding the (m+m')-th horizontal scanning period $H_{m+m'}$. The period is regarded as a luminous period.

[Period $TP(2)_7$] (See FIG. 4 and FIG. 6A.)

Thereafter, the light emitting section ELP is brought to the non-luminous state. More particularly, while the writing transistor $TR_W$ is retained in the off state, a voltage to be fed from the power supply 100 is changed from the voltage $V_{CC-H}$ to the voltage $V_{CC-L}$ at the beginning of the period $TP(2)_7$ (in other words, the beginning of the (m+m')-th horizontal scanning period $H_{m+m'}$). As a result, the potential at the second node $ND_2$ falls down to the voltage $V_{CC-L}$. A reverse-direction voltage is applied between the anode and cathode included in the light emitting section ELP, whereby the light emitting section ELP is brought to the non-luminous state. Along with the fall in the potential at the second node $ND_2$, the potential at the floating first node $ND_1$ (the gate electrode of the driving transistor $TR_D$) falls.

The foregoing non-luminous state is continued until a time point immediately preceding the m-th horizontal scanning period $H_m$ within the next frame. The time point is equivalent to a time point immediately preceding the beginning of the period $TP(2)_{+1}$ shown in FIG. 4. Owing to the inclusion of the non-luminous period, an after-image blur caused by active matrix driving is minimized, and motion-picture definition is improved. For example, if the m' value is set to M/2, the time lengths of the luminous period and non-luminous period correspond to a time length that is substantially a half of one display frame.

Thus, actions to be performed to allow the display element 10, which forms the (n,m)-th sub-pixel, to emit light are completed.

During the period $TP(2)_{+1}$ and subsequent periods, the same steps as the steps described to be performed during the periods $TP(2)_1$ to $TP(2)_7$ are repeatedly carried out (see FIG. 4 and FIG. 6B). The period $TP(2)_7$ shown in FIG. 4 corresponds to the next period $TP(2)_0$.

The optimal overall time $t_0$ of the period $TP(2)_4$ depends on the value of the video signal $V_{Sig\_m}$. Qualitatively, control is preferably extended so that as the value of the voltage $V_{Sig\_m}$ gets smaller, the period $TP(2)_4$ will get longer. The relationship between the video signal $V_{Sig\_m}$ and the optimal overall time $t_0$ will be described below.

Figure 7A:
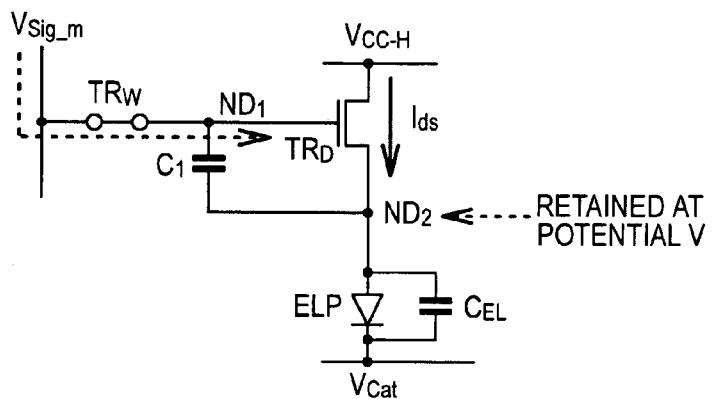
FIG. 7A is a diagram illustratively showing the drive circuit so as to explain a change in the potential at a second node.
Figure 7B:
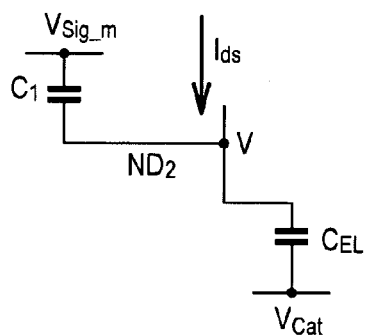
FIG. 7B is an illustrative circuit diagram for use in explaining a change in a charge attributable to the inflow of a drain current into the second node.

As shown in FIG. 7A, when the drain current $I_{ds}$ flows into the second node $ND_2$ during the period $TP(2)_4$, the potential at the second node $ND_2$ rises. A variable V denotes the potential at the second node $ND_2$. The potential difference $V_{gs}$ between the gate electrode of the driving transistor $TR_D$ and the other source/drain region thereof acting as the source region is expressed by an equation (6) presented below.

$$V_{gs} = V_{Sig\_m} - V \quad (6)$$

The drain current $I_{ds}$ that flows during the period $TP(2)_4$ is expressed by an equation (7) presented below on the basis of the equations (1) and (6).

$$I_{ds} = k \cdot \mu \cdot (V_{Sig\_m} - V_{th} - V)^2 \quad (7)$$

With the inflow of the current expressed by the equation (7), charges in the capacitor $C_1$ and the capacitor $C_{EL}$ included in the light emitting section ELP increase. As shown in FIG.

7B, both the capacitor $C_1$ and capacitor $C_{EL}$ have the one ends thereof set to fixed potentials. Therefore, assuming that a variable Q denotes the total amount of charge present in the capacitors $C_1$ and $C_{EL}$, and $C_s$ denotes a capacitance corresponding to the sum of the capacitances of the capacitors $C_1$ and $C_{EL}$ (the value of the capacitance $C_s=c_1+c_{EL}$), an equation (8) presented below is established. An equation (9) presented below is drawn out from the equation (8).

$$I_{ds} = dQ/dt = C_s \cdot dV/dt \tag{8}$$

$$dV/dt = (1/C_s) \cdot I_{ds} \tag{9}$$

An equation (10) presented below is obtained based on the equations (9) and (7).

$$\int \frac{1}{C_S} dt = \int \frac{1}{k \cdot \mu \cdot (V_{Sig\_m} - V_{th} - V)^2} dV \tag{10}$$

At the beginning of the period $TP(2)_4$, the potential at the second node $ND_2$ corresponds to a value $(V_{Ofs} - V_{th})$. Therefore, assuming that $[0, t_0]$ is designated as an integral interval in the left side of the equation (10), the integral interval for the right side of the equation (10) is indicated as $[V_{Ofs} - V_{th}, V]$. Further, since the voltage $V_{Ofs}$ is set to 0 V, the integral interval for the right side of the equation (10) is indicated as $[-V_{th}, V]$. Both the sides of the equation (10) are integrated for the respective integral intervals, and reordered in order to obtain an equation (11) presented below. An equation (12) presented below is then obtained based on the equations (11) and (7).

$$V_{Sig\_m} - V_{th} - V = \frac{V_{Sig\_m}}{1 + \frac{k \cdot \mu \cdot V_{Sig\_m} \cdot t_0}{C_s}} \tag{11}$$

$$I_{ds} = k \cdot \mu \cdot \left(\frac{V_{Sig\_m}}{1 + \frac{k \cdot \mu \cdot V_{Sig\_m} \cdot t_0}{C_S}}\right)^2 \tag{12}$$

The time $t_0$ satisfying the condition that the drain current $I_{ds}$ should not change despite a change in the mobility $\mu$ is a preferred time $t_0$. Therefore, the equation (12) is differentiated with the mobility $\mu$ regarded as a variable. The time $t_0$ associated with the resultant $I_{ds}$ value of 0 is an optimal time $t_0$. When the time is obtained under the condition of $dI_{ds}/d\mu=0$, an equation (13) ensues. When the equation (13) is assigned to the equation (12) and then reordered, an equation (14) ensues.

$$t_0 = C_s/(k \cdot \mu \cdot V_{Sig\_m}) \tag{13}$$

$$I_{ds} = k \cdot \mu \cdot (V_{Sig\_m}/2)^2 \tag{14}$$

Figure 7C:
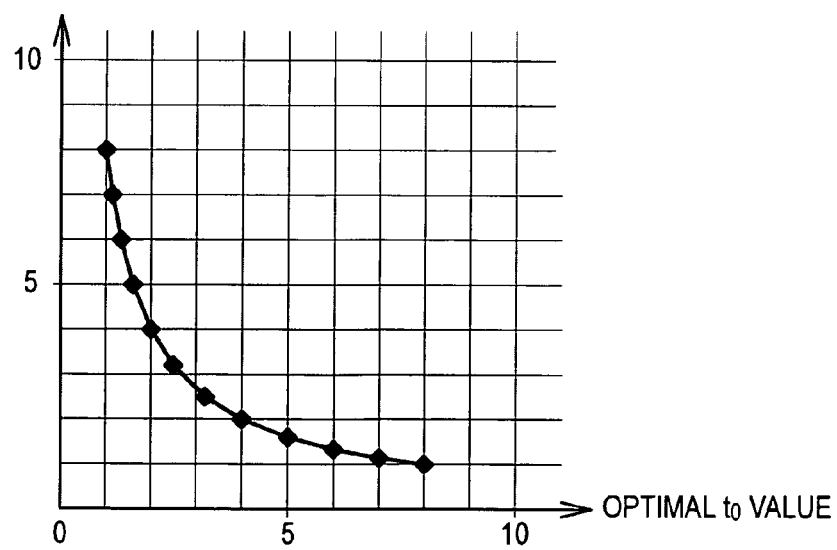
FIG. 7C is a graph for use in explaining the relationship between the value of a video signal and an optimal value of a time $t_0$.

In the equation (13), the video signal $V_{sig\_m}$ changes from 1 V to 8 V according to the luminance of an image. As apparent from the equation (13), the optimal $t_0$ value is inversely proportional to the value of the video signal $V_{Sig\_m}$. Namely, qualitatively, control is preferably extended so that as the value of the video signal $V_{Sig\_m}$ gets smaller, the period $TP(2)_4$ will get longer. FIG. 7C shows the relationship between the value of the video signal $V_{Sig\_m}$ and the optimal time $t_0$. On the axis of abscissas in FIG. 7C, the optimal $t_0$ value associated with the video signal $V_{sig\_m}$ of 8 V is regarded as a reference, and the other optimal $t_0$ values associated with the other video signal values are standardized and plotted.

Since the voltage $V_{Ofs}$ is set to 0 V, 0 is assigned to $V_{Ofs}$ in the equation (5). $I_{ds} = k \cdot \mu \cdot (V_{Sig\_m} - \Delta V)^2$ is drawn out. When this equation is collated with the equation (14), the optimal $\Delta V$ value is seen to be $V_{Sig\_m}/2$. In other words, most preferably, the potential at the second node $ND_2$ is raised by $V_{Sig\_m}/2$ through mobility correcting processing.

Assuming that the optimal value of the time $t_0$ observed when the video signal $V_{Sig\_m}$ is 8 V (white display) is regarded as a reference, when the video signal $V_{Sig\_m}$ is 1 V (black display), the optimal value of the time $t_0$ is approximately eight times larger. According to the driving method of the preferred embodiment, the optimal value of the time $t_0$ largely varies depending on the value of the video signal $V_{Sig\_m}$. If the writing transistor $TR_W$ can be driven so that the length of the period $TP(2)_4$ shown in FIG. 4 will be varied depending on the value of the video signal $V_{Sig\_m}$, mobility correction can be achieved appropriately. As described later, since the trailing edge of the scanning signal to be applied to the gate electrode of the writing transistor $TR_W$ during writing processing is made inclined, the length of the period $TP(2)_4$ can be varied depending on the value of the video signal $V_{Sig\_m}$.

FIG. 8 illustratively shows the relationship among the potential on the data line DTL, the potential on the scan line SCL, the state of the driving transistor $TR_D$, the potential at the first node $ND_1$, and the potential at the second node $ND_2$ which are observed during the horizontal scanning period $H_m$ including the period $TP(2)_4$ shown in FIG. 4.

Assuming that $V_{th\_TRW}$ denotes the threshold voltage of the writing transistor $TR_W$, the end of the period $TP(2)_4$ corresponds to a time point at which the potential on the scan line SCL falls below a value $V_{Sig\_m} + V_{th\_TRW}$. As shown in FIG. 8, the trailing edge of the scanning signal to be applied to the gate electrode of the writing transistor $TR_W$ during writing processing is made inclined. The period during which the video signal $V_{Sig\_m}$ is applied to the first node $ND_1$ over the data line DTL during the writing processing is adjusted so that the end thereof will be delayed more greatly as the value of the video signal $V_{Sig\_m}$ gets smaller.

As mentioned above, the optical $t_0$ value is inversely proportional to the value of the video signal $V_{Sig\_m}$. Therefore, as shown in FIG. 8, the trailing edge of the scanning signal is preferably inclined to have a large slope in an early stage of a fall and a small slope in a later stage of the fall. Thus, the length of the period $TP(2)_4$ shown in FIG. 4 can be preferably varied depending on the value of the video signal $V_{Sig\_m}$.

FIG. 9 is an illustrative circuit diagram for use in explaining the configuration of the scan circuit 101. As shown in FIG. 9, a signal sent from a shift register 101A included in the scan circuit 101 is inputted to the level shift circuits 101B. A voltage modulation circuit 101C connected to the level shift circuits 101B modulates the voltage to be fed to the level shift circuits 101B, whereby the trailing edge of the scanning signal is inclined.

Actions have been described on the assumption that the crest value of the scanning signal to be applied to the scan line SCL remains constant. Due to the aforesaid actions, a variance in the luminance derived from a variance in the property of the driving transistor $TR_D$ is alleviated. However, for example, a phenomenon that the luminance attained by the display elements 10 connected onto the scan lines vary row by row may be observed. According to the driving method of the preferred embodiment, the luminance characteristic of the display elements 10 connected onto each of the scan lines SCL are controlled by controlling the crest value of the scanning signal, which is applied to the first to M-th scan lines SCL, for each of the scan line SCL. More particularly, by controlling a voltage to be applied to each of the level shift circuits 101B, the crest value of the scanning signal to be outputted from the output side of each of the level shift circuits 101B is controlled.

Figure 10:
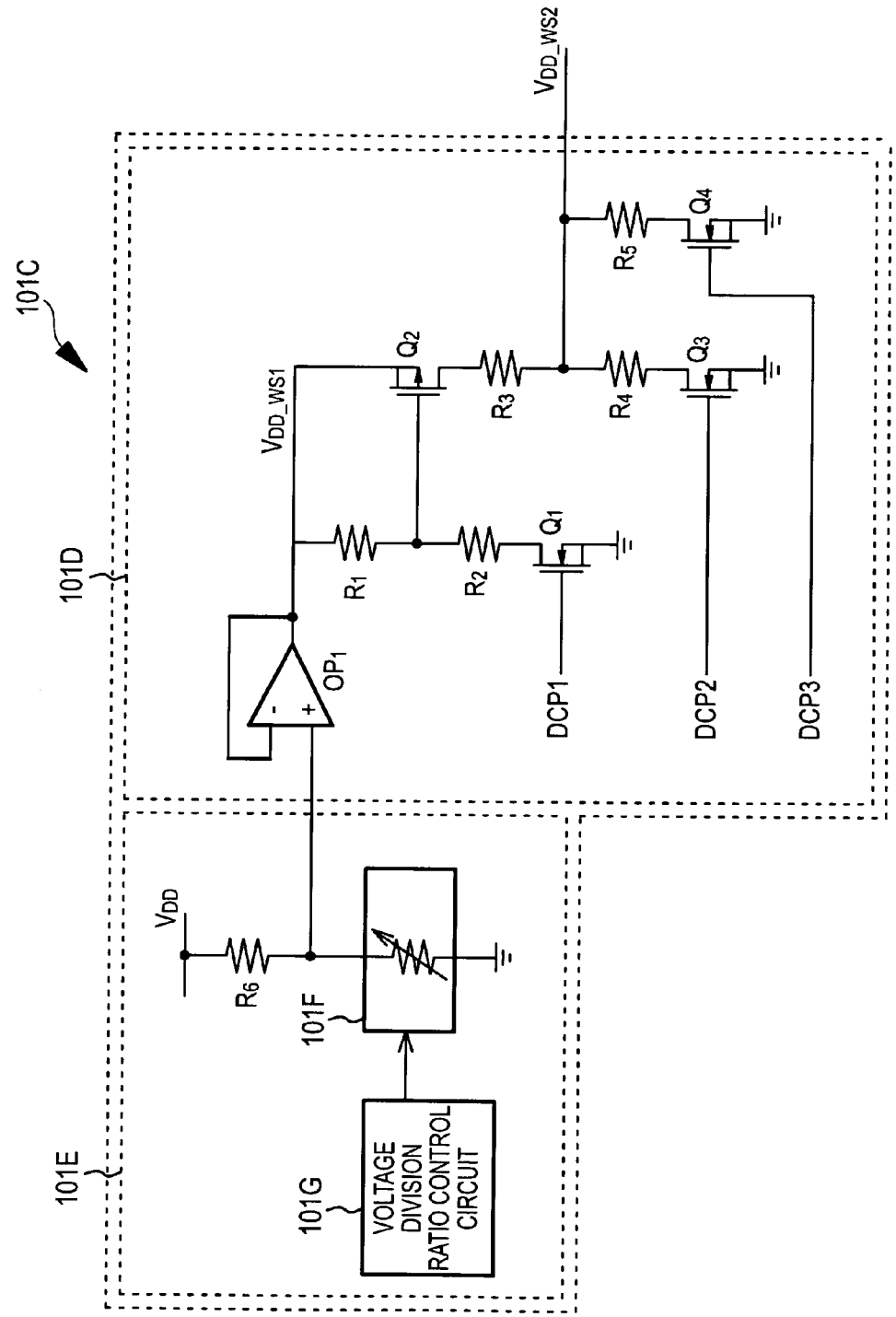
FIG. 10 is an illustrative circuit diagram for use in explaining the configuration of a voltage modulation circuit included in the scan circuit.
Figure 11:
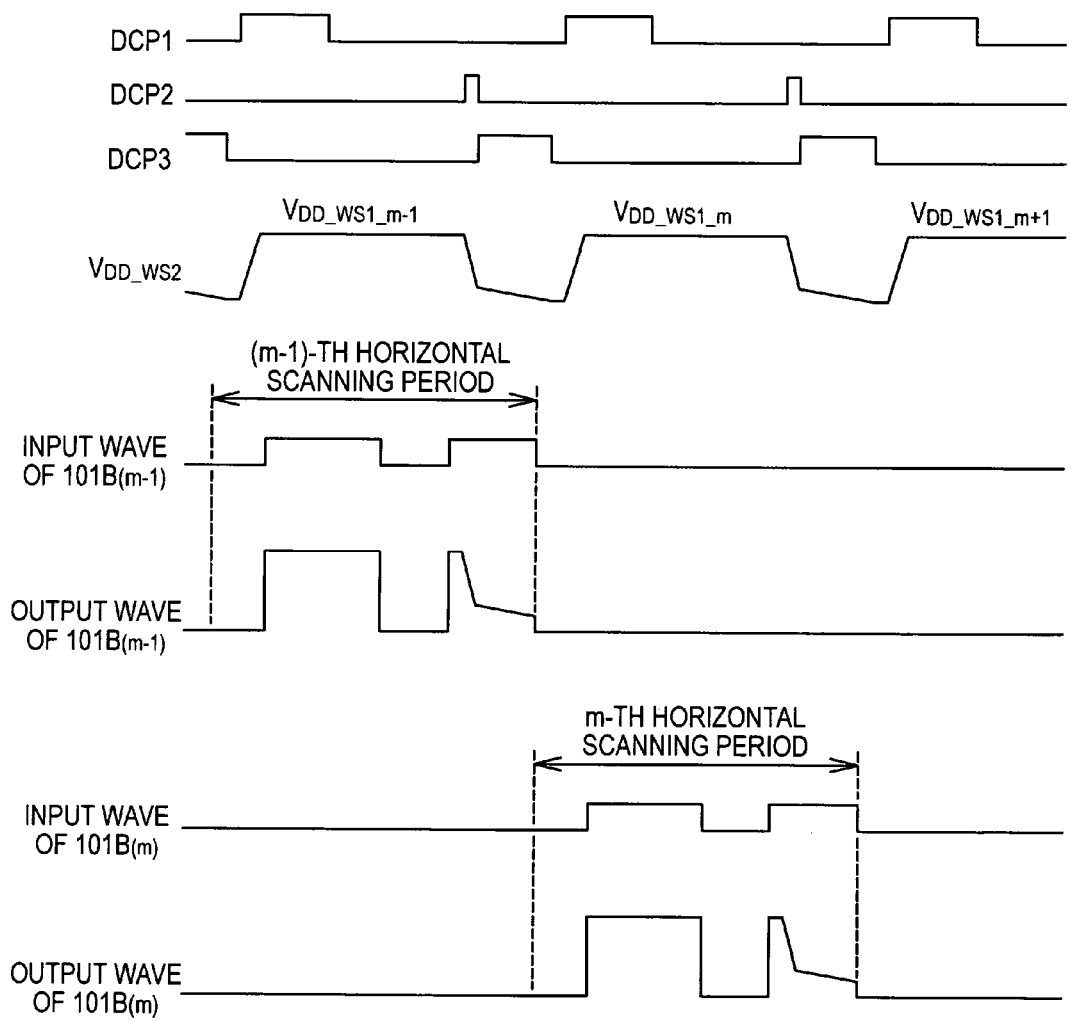
FIG. 11 is a diagram illustratively showing a timing chart for various signals to be inputted to the voltage modulation circuit and the scan signal outputted from a level shift circuit.

Referring to FIG. 10 and FIG. 11, the configuration of the voltage modulation circuit 101C will be described below. The voltage modulation circuit 101C includes a discrete circuit 101D and a voltage feed circuit 101E that controls the operating voltage for the discrete circuit 101D. The discrete circuit 101D includes an operational amplifier OP1, four transistors Q1, Q2, Q3, and Q4, and five resistors R1, R2, R3, R4, and R5. The operational amplifier OP1 is connected to serve as a voltage follower. $V_{DD\_WS1}$ denotes an output voltage of the operational amplifier OP1. The signals DCP1, DCP2, and DCP3 shown in FIG. 11 are applied to the gate electrodes of the respective transistors Q1, Q3, and Q4 included in the discrete circuit 101D. The signals are synchronous with the horizontal scanning period, produced by a known logic circuit that is not shown, and then fed to the discrete circuit 101D.

The voltage feed circuit 101E includes a resistor R6 to be used to produce a fraction of a voltage $V_{DD}$ (for example, 30 V) and a digital potentiometer 101F. The voltage feed circuit 101E further includes a voltage division ratio control circuit 101G that controls a value to which the digital potentiometer 101F is set. Assuming that $r_{\_101F}$ denotes a resistance offered by the digital potentiometer 101F, a voltage having a value of $V_{DD} \cdot r_{\_101F}/(R6+r_{\_101F})$ is applied to the input terminal (+ side) of the operational amplifier OP1 included in the discrete circuit 101D. Therefore, the output voltage $V_{DD\_WS1}$ of the operational amplifier OP1 is calculated as $V_{DD} \cdot r_{\_101F}/(R6+r_{\_101F})$.

The resistance $r_{\_101F}$ offered by the digital potentiometer 101F is controlled with a signal, which is sent from the voltage division ratio control circuit 101G, synchronously with the timing of scanning the scan line SCL. More particularly, the voltage division ratio control circuit 101G references a correction factor associated with the scan line SCL and stored in a memory unit that is not shown, and applies a signal to the digital potentiometer 101F. The correction factor is calculated based on the luminance characteristic of the display elements juxtaposed in each row, which is obtained during inspection of the display device, and stored in advance in the memory means that is not shown. The correction factor may be stored in the memory means so that it can be rewritten if necessary.

The output voltage $V_{DD\_WS1}$ of the operational amplifier OP1, and the signals DCP1, DCP2, and DCP3 are applied to the discrete circuit 101D. When the resistance $r_{\_101F}$ remains constant irrespective of whether the scan line SCL is scanned, the output voltage $V_{DD\_WS2}$ of the discrete circuit 101D takes on a waveform shown in FIG. 11. A predetermined rectangular wave is inputted from the shift resistor 101A to the input side of the level shift circuit 101B during an associated horizontal scanning period. The aforesaid output voltage $V_{DD\_WS2}$ is applied from the voltage modulation circuit 101C connected to the level shift circuit 101B. The output signal (scanning signal) of the level shift circuit 101B therefore takes on a waveform shown in FIG. 11.

Figure 12:
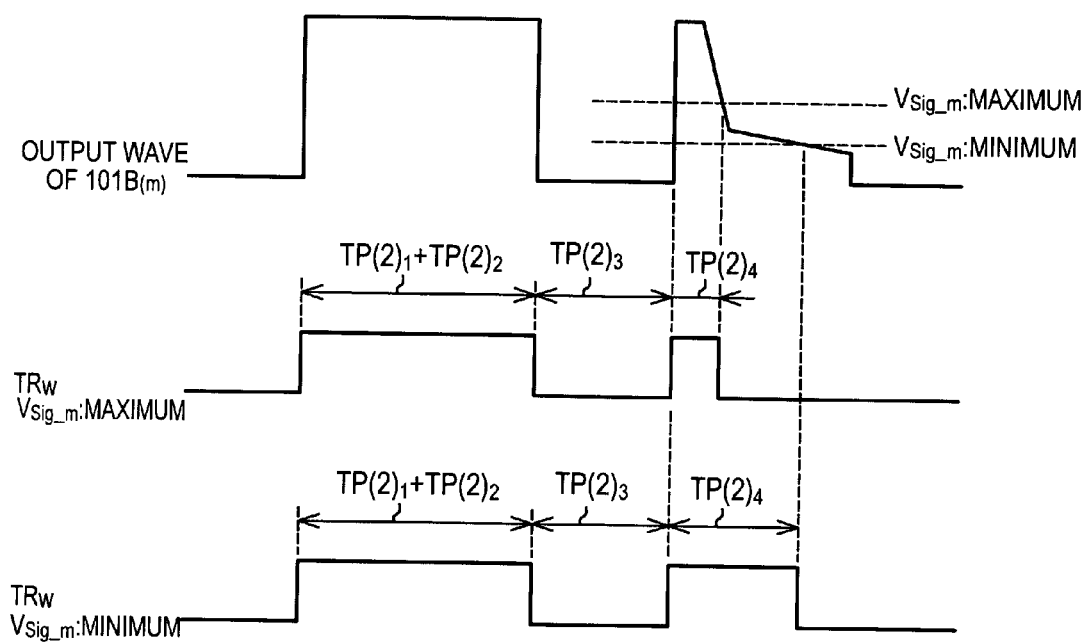
FIG. 12 is a diagram illustratively showing a timing chart indicating the relationship between the scanning signal and the on or off state of the writing transistor so as to explain the fact that the length of the period $TP(2)_4$ shown in FIG. 4 varies depending on the value of the video signal.

Referring to FIG. 12, a description will be made of the fact that the length of the period $TP(2)_4$ shown in FIG. 4 varies depending on the value of the video signal $V_{Sig\_m}$. As described in conjunction with FIG. 8, it is when the potential on the scan line SCL falls below $V_{Sig\_m}+V_{th\_TRW}$ that the writing transistor $TR_W$ is put to the off state with the video signal $V_{Sig\_m}$ applied to the data line DTL. Therefore, as shown in FIG. 12, control is extended so that: when the value of the video signal $V_{Sig\_m}$ is large, the length of the period $TP(2)_4$ will get shorter; and when the value of the video signal $V_{Sig\_m}$ is small, the length of the period $TP(2)_4$ will get longer.

Now, a description will be made of actions to be performed when the luminance characteristic of the display elements 10 in the m-th row are relatively inferior to the luminance characteristic of the display elements 10 in the other rows. The voltage division ratio control circuit 101G references a correction factor associated with the scan line SCL in the m-th row, and applies a signal to the digital potentiometer 101F synchronously with the associated horizontal scanning period $H_m$. The resistance $r_{\_101F}$ offered by the digital potentiometer 101F is set to a value relatively smaller than a predetermined reference value. Therefore, the voltage $V_{DD\_WS1}$ to be applied to the m-th level shift circuit 101B is controlled to fall during the horizontal scanning period $H_m$.

Figure 13:
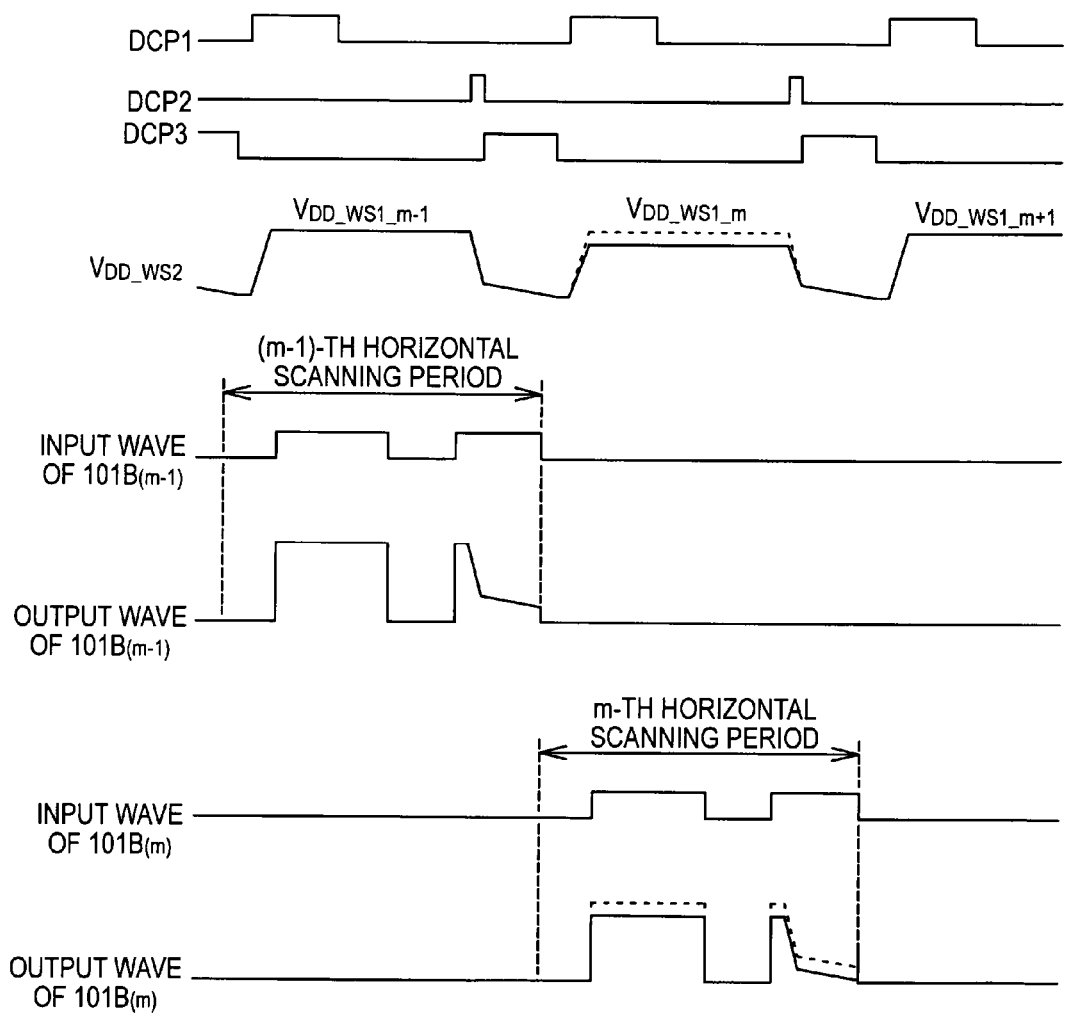
FIG. 13 is a diagram illustratively showing a timing chart for various signals, which are inputted to the voltage modulation circuit after the crest value of the scanning signal is adjusted, and the scanning signal outputted from the level shift circuit.
Figure 14:
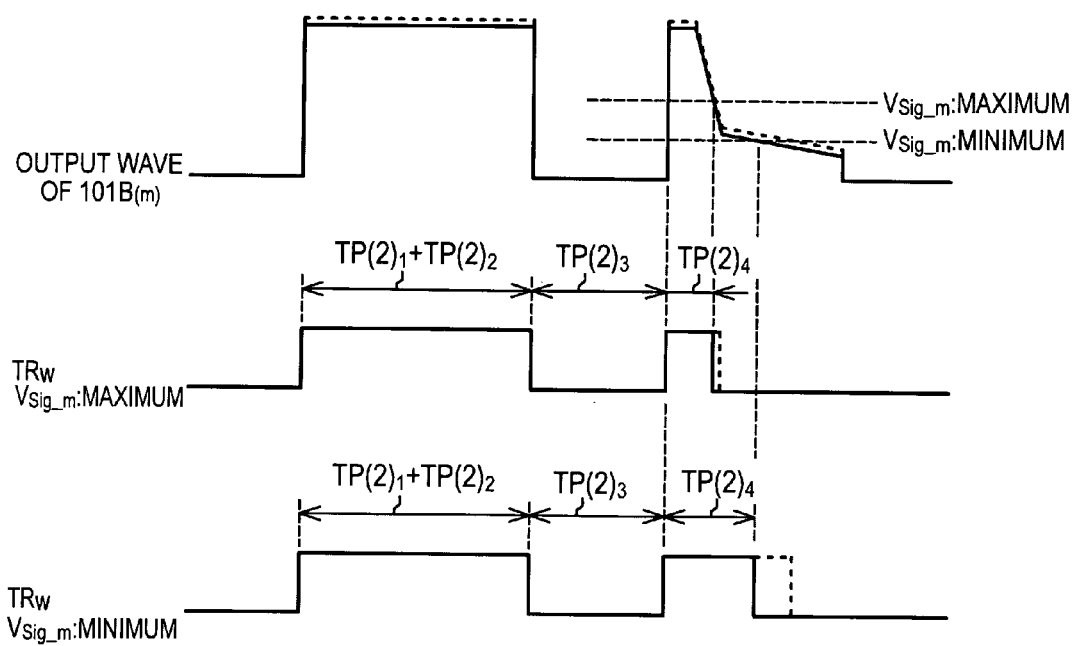
FIG. 14 is a diagram illustratively showing a timing chart indicating the relationship between the scanning signal and the on or off state of the writing transistor so as to explain the fact that the length of the period $TP(2)_4$ shown in FIG. 4 is varied by adjusting the crest value of the scanning signal.

As shown in FIG. 13, the crest value of the scanning signal to be outputted from the m-th level shift circuit 101B falls during the m-th horizontal scanning period $H_m$. In FIG. 13, a change in the crest value is exaggerated. As shown in FIG. 14, the lengths of the periods $TP(2)_1$, $TP(2)_2$ and $TP(2)_3$ remain basically unaffected despite a slight increase or decrease in the crest value of the scanning signal. However, the length of the $TP(2)_4$ varies to get shorter along with a decrease in the crest value of the scanning signal, and varies to get longer along with an increase in the crest value of the scanning signal.

For the display elements 10 in the m-th row, the length of the period $TP(2)_4$ is short. Accordingly, the value of the potential correction value $\Delta V$ is small. The drain current $I_{ds}$ of the driving transistor $TR_D$ is provided as the equation (5). As a result, in each of the display elements in the m-th row, a current flowing from the driving transistor $TR_D$ to the light emitting section ELP increases. Therefore, the luminance characteristic of the display elements 10 in the m-th row is corrected to be upgraded.

If the luminance characteristic of the display elements 10 in the m-th row is relatively superior to the luminance characteristics of the display elements 10 in the other rows, the voltage $V_{DD\_WS1}$ to be applied to the m-th level shift circuit 101B is controlled to rise during the horizontal scanning period $H_m$. Therefore, for the display elements 10 in the m-th row, the length of the period $TP(2)_4$ is long. Accordingly, the aforesaid value of the potential correction value $\Delta V$ increases, and the drain current $I_{ds}$ of the driving transistor $TR_D$ decreases. Since a current flowing from the driving transistor $TR_D$ to the light emitting section ELP decreases, the luminance characteristic of the display elements 10 in the m-th row is corrected to degrade.

As mentioned above, by changing the crest value of the scanning signal, the luminance characteristics of the display elements 10 connected onto the scan lines SCL can be readily adjusted row by row, and image display superior in uniformity of a luminance can be achieved.

The present invention has been described based on the preferred embodiment. The present invention is not limited to the preferred embodiment. The configuration or structure of the display device or display element in accordance with the preferred embodiment, and the steps of the driving method for the display device in accordance with the preferred embodiment are presented as mere examples, and can therefore be modified appropriately.

Figure 15:
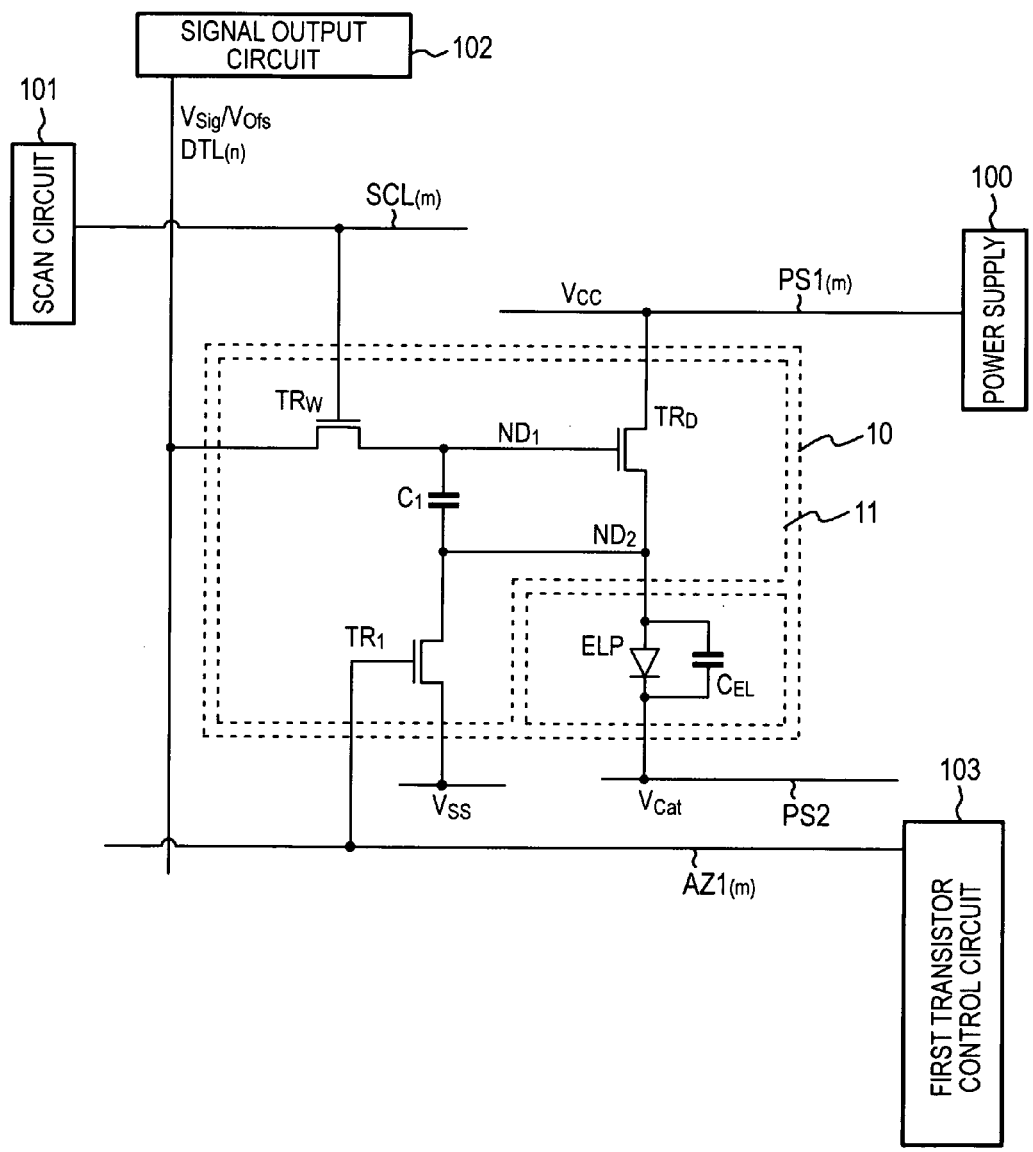
FIG. 15 is a circuit diagram showing an equivalent circuit of the display element including the drive circuit.

For example, as shown in FIG. 15, the drive circuit 11 included in the display device 10 may include a transistor (first transistor $TR_1$) connected to the second node $ND_2$. In the first transistor $TR_1$, a second-node initialization voltage $V_{SS}$ is applied to one of the source/drain regions thereof, and the other source/drain region thereof is connected to the second node $ND_2$. A signal sent from a first transistor control circuit 103 is applied to the gate electrode of the first transistor $TR_1$ over a first transistor control line AZ1, whereby the on/off state of the first transistor $TR_1$ is controlled. Thus, the potential at the second node $ND_2$ can be designated.

Figure 16:
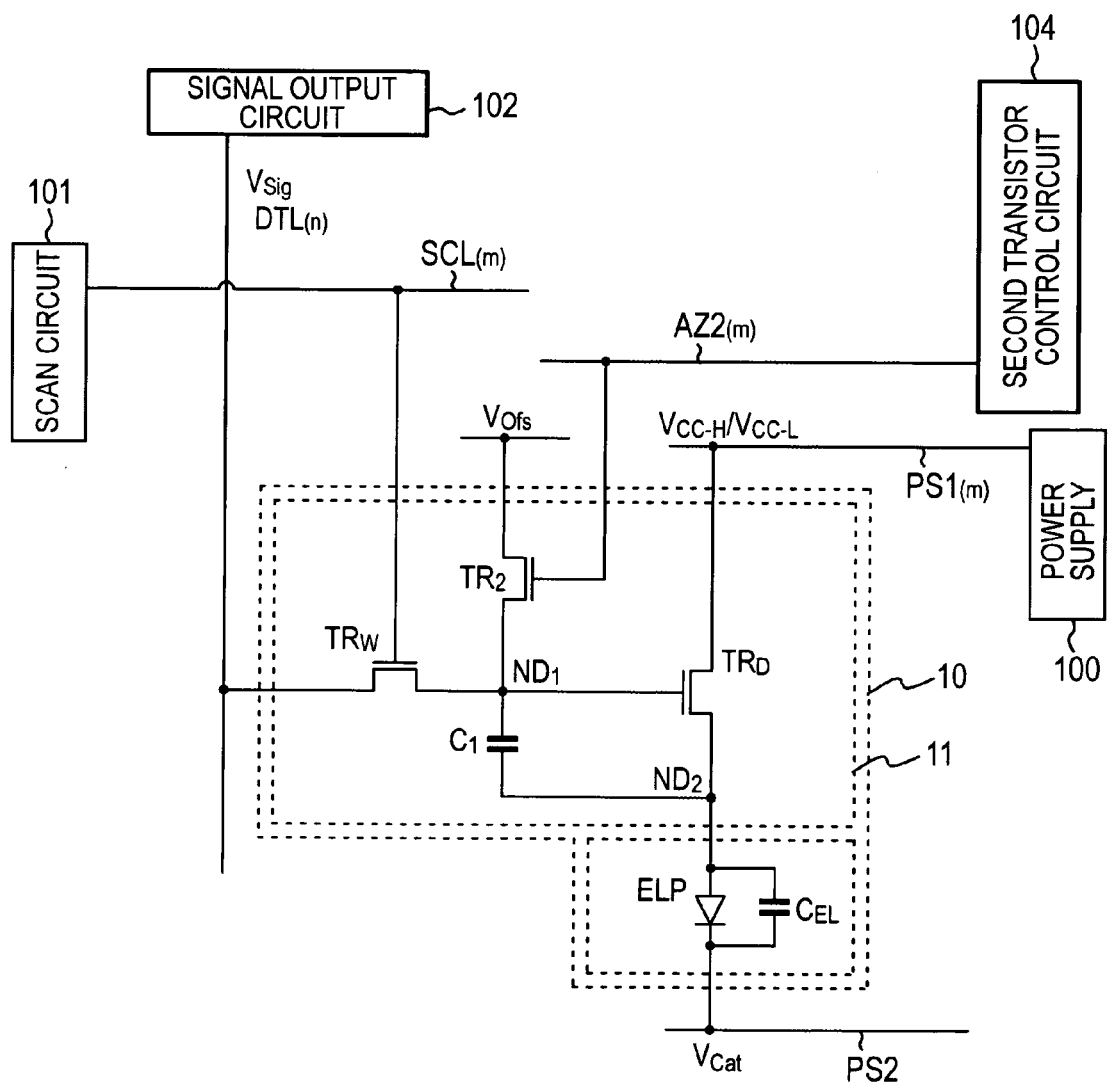
FIG. 16 is a circuit diagram showing an equivalent circuit of the display element including the drive circuit.

Otherwise, as shown in FIG. 16, the drive circuit 11 included in the display element 10 may include a transistor connected to the first node $ND_1$ (second transistor $TR_2$). In the second transistor $TR_2$, the first-node initialization voltage $V_{Ofs}$ is applied to one of the source/drain regions thereof, and the other source/drain region thereof is connected to the first node $ND_1$. A signal sent from a second transistor control circuit 104 is applied to the gate electrode of the second transistor $TR_2$ over a second transistor control line AZ2, whereby the on/off state of the second transistor $TR_2$ is controlled. Therefore, the potential at the first node $ND_1$ can be designated.

Figure 17:
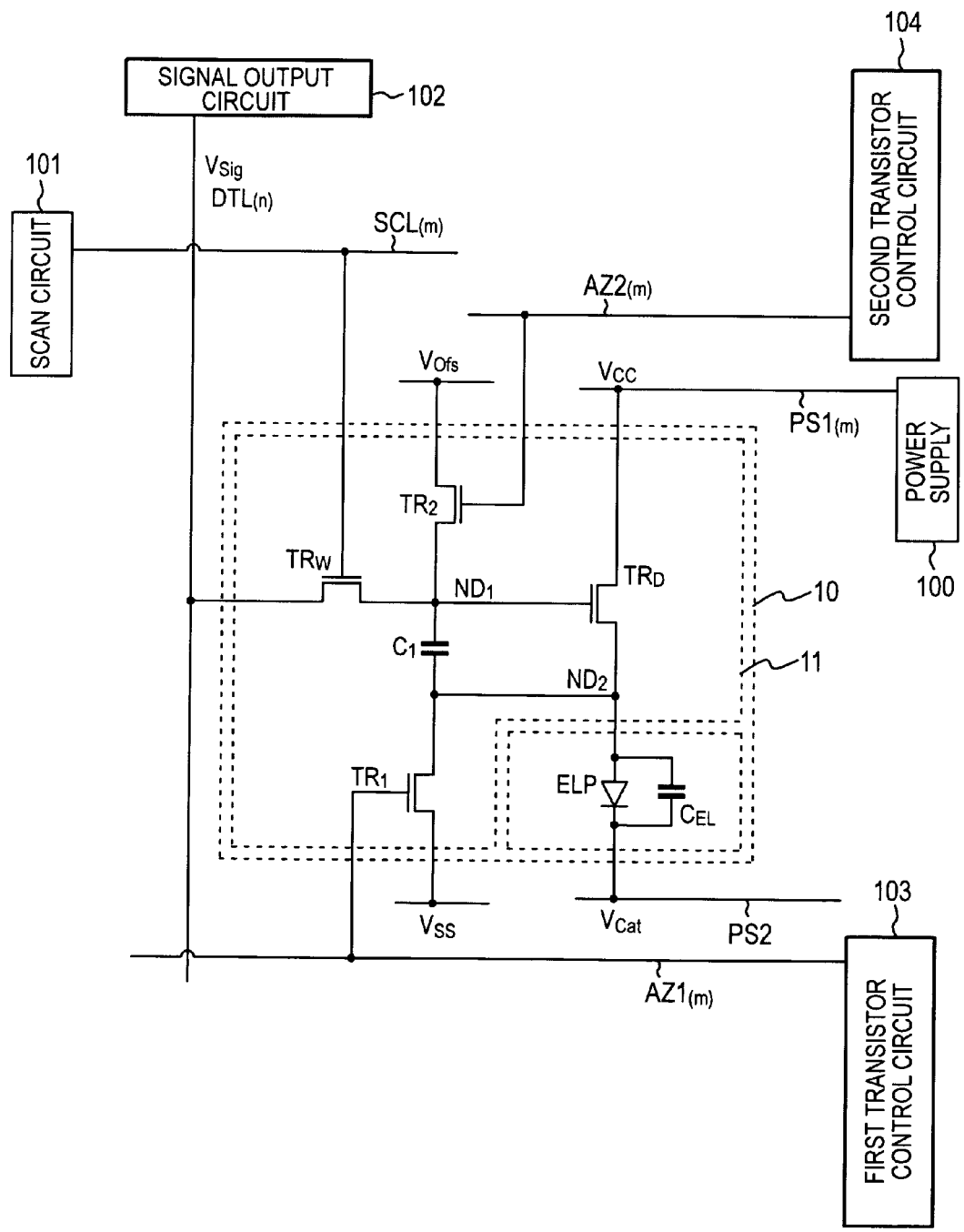
FIG. 17 is a circuit diagram showing an equivalent circuit of the display element including the drive circuit.

Further, as shown in FIG. 17, the drive circuit 11 included in the display element 10 may include both the first transistor $TR_1$ and second transistor $TR_2$. In addition, the drive circuit may include another transistor.

The present application contains subject matter related to that disclosed in Japanese Priority Patent Application JP 2009-027336 filed in the Japan Patent Office on Feb. 9, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A driving method for a display device including
(1) a scan circuit,
(2) a signal output circuit,
(3) display elements which are arrayed in the form of a two-dimensional matrix having a total of N×M display elements, that is, N display elements juxtaposed in a first direction and M display elements juxtaposed in a second direction different from the first direction, and each of which includes a current-driven light emitting section and a drive circuit,
(4) M scan lines coupled to the scan circuit and extended in the first direction,
(5) N data lines coupled to the signal output circuit and extended in the second direction, and
(6) a power supply,
the drive circuit including a writing transistor, a driving transistor, and a capacitor, and
in the display element located in the m-th row (where m denotes 1, 2, etc., or M) and the n-th column (where n denotes 1, 2, etc., or N),
(A-1) one of the source/drain regions of the driving transistor being connected to the power supply,
(A-2) the other source/drain region of the driving transistor being connected to an anode included in the light emitting section, and also connected to one of electrodes of the capacitor in order to thus form a second node,
(A-3) the gate electrode of the driving transistor being connected to the other source/drain region of the writing transistor, and also connected to the other electrode of the capacitor in order to thus form a first node,
(B-1) one of the source/drain regions of the writing transistor being connected to the n-th data line, and
(B-2) the gate electrode of the writing transistor being connected to the m-th scan line,
the driving method for the display device comprising the steps of:
performing writing processing to apply a video signal to the first node over the data line via the writing transistor with a predetermined driving voltage applied from the power supply to one of the source/drain regions of the driving transistor, wherein
the trailing edge of a scanning signal to be applied to the gate electrode of the writing transistor at the writing processing step is inclined; and
the luminance characteristic of the display elements connected onto each of the scan lines is controlled by controlling the crest value of the scanning signal, which is applied to the first to M-th scan lines, for each of the scan lines.

2. The driving method for the display device according to claim 1, wherein:
the scan circuit includes level shift circuits associated with the scan lines, and the scan lines are coupled to the output sides of the level shift circuits; and
the crest value of the scanning signal to be outputted from the output side of each of the level shift circuits is controlled by controlling a voltage to be applied to each of the level shift circuits.

3. The driving method for the display device according to claim 1, wherein the trailing edge of the scanning signal is inclined to have a large slope in an early stage of the fall and a small slope in a later stage thereof.

4. The driving method for the display device according to claim 1, wherein:
pre-processing is performed to initialize the potential at the first node and the potential at the second node for fear the potential difference between the first node and second node may exceed the threshold voltage of the driving transistor and the potential difference between the second node and a cathode included in the light emitting section may exceed the threshold voltage of the light emitting section;
the writing processing step is implemented after threshold-voltage canceling processing is performed to change the potential at the second node toward a potential, which is obtained by subtracting the threshold voltage of the driving transistor from the potential at the first node, with the potential at the first node held intact; and
the first node is floated by bringing the writing transistor to an off state with the scanning signal sent over the scan line, and the light emitting section is driven by feeding a current, which is consistent with the potential difference between the first node and second node, to the light emitting section via the driving transistor with a predetermined driving voltage applied from the power supply to one of the source/drain regions of the driving transistor.

5. The driving method for the display device according to any of claims 1 to 4, wherein the light emitting section is realized with an organic electroluminescent light emitting section.

6. A display device comprising:
(1) a scan circuit;
(2) a signal output circuit;
(3) display elements which are arrayed in the form of a two-dimensional matrix having a total of N×M display elements, that is, N display elements juxtaposed in a first direction and M display elements juxtaposed in a second direction different from the first direction, and each of which includes a current-driven light emitting section and a drive circuit;
(4) M scan lines coupled to the scan circuit and extended in the first direction;
(5) N data lines coupled to the signal output circuit and extended in the second direction; and
(6) a power supply, wherein
the drive circuit includes a writing transistor, a driving transistor, and a capacitor;
in the display element located in the m-th row (where m denotes 1, 2, etc., or M) and the n-th column (where n denotes 1, 2, etc., or N),
(A-1) one of the source/drain regions of the driving transistor is connected to the power supply,
(A-2) the other source/drain region of the driving transistor is connected to an anode included in the light emitting section, and also connected to one of the electrodes of the capacitor in order to thus form a second node,
(A-3) the gate electrode of the driving transistor is connected to the other source/drain region of the writing transistor, and also connected to the other electrode of the capacitor in order to thus form a first node,
(B-1) one of the source/drain regions of the writing transistor is connected onto the n-th data line, and
(B-2) the gate electrode of the writing transistor is connected onto the m-th scan line;
a video signal is applied to the first node over the data line via the writing transistor with a predetermined driving voltage applied from the power supply to one of the source/drain regions of the driving transistor;
the trailing edge of the scanning signal is inclined; and
the crest value of the scanning signal to be applied to the first to M-th scan lines is controlled for each of the scan lines.

* * * * *